(12) United States Patent
Hasegawa et al.

(10) Patent No.: US 6,954,255 B2
(45) Date of Patent: Oct. 11, 2005

(54) EXPOSURE APPARATUS

(75) Inventors: Noriyasu Hasegawa, Tochigi (JP); Shigeru Terashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 10/170,590

(22) Filed: Jun. 14, 2002

(65) Prior Publication Data

US 2002/0191166 A1 Dec. 19, 2002

(30) Foreign Application Priority Data

Jun. 15, 2001 (JP) ............................. 2001-182527
Jun. 15, 2001 (JP) ............................. 2001-182528

(51) Int. Cl.[7] .................... G03B 27/52; G03B 27/42
(52) U.S. Cl. .................................. 355/30; 355/53
(58) Field of Search ................. 355/30, 53, 72–76; 310/10, 12; 318/649; 378/34, 35; 430/5, 430/20, 30

(56) References Cited

U.S. PATENT DOCUMENTS

| | | | |
|---|---|---|---|
| 4,998,821 A * | 3/1991 | Ohta et al. .................... 353/122 |
| 5,063,582 A | 11/1991 | Mori et al. ..................... 378/34 |
| 5,093,579 A | 3/1992 | Amemiya et al. ........ 250/453.1 |
| 5,138,643 A | 8/1992 | Sakamoto et al. ............. 378/34 |
| 5,157,700 A | 10/1992 | Kurosawa et al. ............. 378/34 |
| 5,231,291 A | 7/1993 | Amemiya et al. ........ 250/443.1 |
| 5,559,584 A | 9/1996 | Miyaji et al. .................. 355/73 |
| 5,898,477 A | 4/1999 | Yoshimura et al. ............ 355/53 |
| 6,317,479 B1 * | 11/2001 | Chiba et al. .................... 378/35 |
| 6,463,119 B1 | 10/2002 | Terashima et al. ............. 378/34 |
| 6,542,220 B1 * | 4/2003 | Schrijver et al. .............. 355/53 |
| 6,555,834 B1 | 4/2003 | Loopstra .................. 250/492.3 |
| 6,665,046 B2 * | 12/2003 | Nogawa et al. ................ 355/30 |
| 2001/0055326 A1 | 12/2001 | Miwa et al. ................... 372/57 |
| 2002/0002946 A1 | 1/2002 | Tanaka et al. .............. 118/719 |
| 2002/0018190 A1 | 2/2002 | Nogawa et al. ................ 355/30 |
| 2002/0112784 A1 | 8/2002 | Tanaka et al. .............. 148/213 |
| 2002/0191163 A1 | 12/2002 | Hasegawa et al. ............. 355/30 |
| 2002/0191166 A1 | 12/2002 | Hasegawa et al. ............. 355/53 |
| 2003/0006380 A1 | 1/2003 | Van Empel et al. ..... 250/492.3 |
| 2003/0146396 A1 | 8/2003 | Loopstra .................. 250/492.2 |

(Continued)

FOREIGN PATENT DOCUMENTS

EP          0 957 402 A2      11/1999

(Continued)

OTHER PUBLICATIONS

European Search Report dated Aug. 19, 2004, issued in corresponding European patent appln. No. 03 25 0001, forwarded in a Communication dated Aug. 30, 2004.

*Primary Examiner*—Henry Hung Nguyen
(74) *Attorney, Agent, or Firm*—Fitzpatrick, Cella, Harper & Scinto

(57) ABSTRACT

An exposure apparatus which projects a pattern formed on a mask onto a substrate by using exposure light. The apparatus includes a shielding member which surrounds a light path space through which exposure light passes and has a passage which makes the light path space communicate with an ambient space, and a gas supply system which supplies inert gas to the light path space surrounded by the shielding member. A direction of the passage coincides with a flow direction of an ambient atmosphere which flows through the ambient space, and the passage includes a first passage and a second passage. The first passage is located at a position upstream, with respect to the flow direction, relative to the second passage, and the first passage is smaller in section than the second passage.

19 Claims, 23 Drawing Sheets

U.S. PATENT DOCUMENTS

2003/0169407 A1    9/2003    Hasegawa et al. ............ 355/30

FOREIGN PATENT DOCUMENTS

| | | |
|---|---|---|
| EP | 1 020 897 A1 | 7/2000 |
| EP | 1 098 225 A2 | 5/2001 |
| EP | 1 098 226 A2 | 5/2001 |
| EP | 1 229 573 A1 | 8/2002 |
| JP | 54-69404 | 6/1979 |
| JP | 6-260385 | 9/1994 |
| JP | 11-111586 | 4/1999 |
| JP | 10-214782 | 8/1999 |
| JP | 2000-200745 | 7/2000 |
| JP | 2001-118783 | 4/2001 |
| JP | 2001-168027 | 6/2001 |
| JP | 2001-250759 | 9/2001 |
| JP | 2001-284224 | 10/2001 |
| JP | 2001-297972 | 10/2001 |
| JP | 2001-358056 | 12/2001 |
| WO | WO/016548 A1 | 1/2001 |
| WO | WO 01/84241 A1 | 11/2001 |

* cited by examiner

FIG. 7
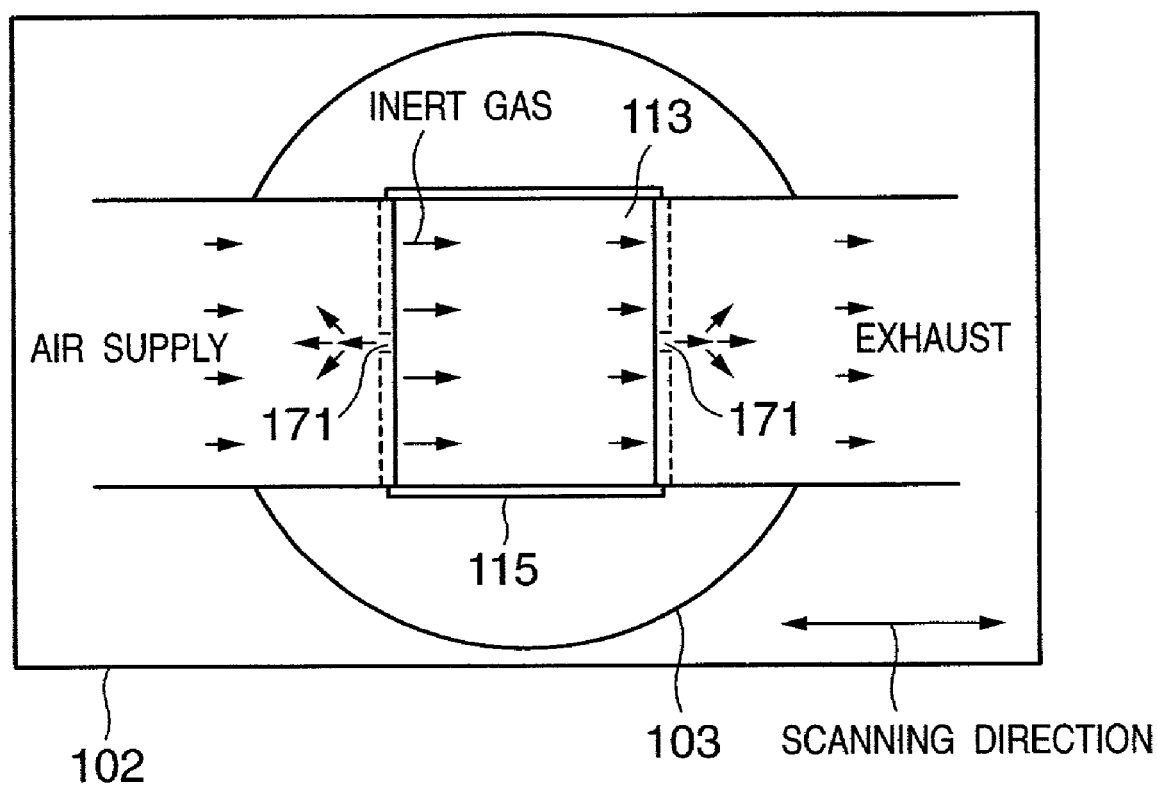
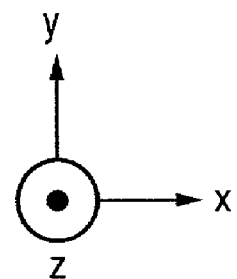

EXPOSURE APPARATUS

FIELD OF THE INVENTION

The present invention relates to an exposure apparatus used to manufacture a semiconductor element, an image sensing element, a liquid crystal display element, a thin-film magnetic head, and any other type of microdevices.

BACKGROUND OF THE INVENTION

Photolithography for manufacturing a semiconductor element, or the like, adopts an exposure apparatus which exposes a photosensitive substrate to the pattern image of a mask (e.g., a reticle) via a projection optical system. Recently, semiconductor integrated circuits have been developed toward micropatterning, and the wavelength of a photolithography light source is being decreased in photolithography.

Such an exposure apparatus suffers a decrease in the intensity of exposure light under the influence of absorption of exposure light by oxygen in the use of, as exposure light, vacuum ultraviolet rays, particularly, light with a wavelength shorter than 250 nm such as a KrF excimer laser beam (wavelength: 248 nm), an ArF excimer laser beam (wavelength: 193 nm), or an $F_2$ laser beam (wavelength: 157 nm), harmonic light such as a YAG laser beam, or X-rays.

The prior art avoids a decrease in the transmittance of light as follows: a closed space which confines only an optical path is formed in an exposure apparatus having a light source such as an $F_2$ excimer laser, and gas in the closed space is purged with gas such as nitrogen not containing oxygen.

FIG. 13 is a view showing an exposure apparatus which executes exposure by supplying inert gas into a space defined by an optical member on the final stage of a projection optical system (lens barrel) and a photosensitive substrate (wafer) and forming an inert gas atmosphere in the space. In this exposure apparatus, shielding members are arranged around the space in order to separate the space in the exposure region from an ambient atmosphere. Inert gas is supplied from the vicinity of the exposure region to the space.

The exposure apparatus shown in FIG. 13 requires several seconds until the oxygen concentration in the space in the exposure region decreases after a wafer stage is driven to load a wafer into the exposure region. This results in low throughput.

The same problem occurs when inert gas is supplied to the vicinity of a reticle. Also, for the reticle, the exposure apparatus requires several seconds until the oxygen concentration in a space surrounded by shielding members decreases, which decreases the throughput.

SUMMARY OF THE INVENTION

The present invention has been made in consideration of the above situation, and has as its object to shorten a time required to purge, with inert gas, gas in an optical path space including a space through which light passes, such as a space between a projection optical system and a substrate, a space between an illumination optical system which illuminates a mask (e.g., a reticle) and a mask stage which holds the mask, and a space between the mask stage and the projection optical system.

To achieve the above object, according to the present invention, there is provided an exposure apparatus which projects and transfers a pattern formed on a mask to a substrate by using exposure light, characterized by comprising a shielding member which surrounds a side plane of an optical path space including a space through which exposure light passes, and a gas supply portion which supplies inert gas to the optical path space surrounded by the shielding member, wherein the shielding member has a passage which makes the optical path space communicate with an ambient space. This arrangement can increase, e.g., the exhaust efficiency of gas which stays in an optical path space surrounded by the shielding member. As a result, the purge time of inert gas can be shortened.

According to a preferred aspect of the present invention, the passage is formed at a portion where a flow velocity of inert gas supplied from the gas supply portion decreases unless the passage is formed. Since the passage is formed at the portion where the flow velocity may decrease, a flow path can be formed at this portion to shorten the purge time.

According to another preferred aspect of the present invention, the exposure apparatus further comprises an exhaust portion which exhausts inert gas from the optical path space, and the passage is positioned closer to the gas supply portion than to the exhaust portion. The flow velocity increases at a portion near the exhaust portion, and the purge time can be shortened.

According to still another preferred aspect of the present invention, the shielding member may comprise an exposure light opening at a portion through which exposure light passes, and the passage may be formed at a position spaced apart from the exposure light opening. This arrangement can increase the flow velocity at the position spaced apart from the exposure light opening, and shorten the purge time.

According to still another preferred aspect of the present invention, the shielding member may comprise an exposure light opening at a portion through which exposure light passes, and the passage may be formed at a position near the exposure light opening. This arrangement can increase the flow velocity at the position near the exposure light opening, and shorten the purge time.

According to still another preferred aspect of the present invention, the gas supply portion may comprise two supply ports at opposite positions, and the passage may be formed at an almost middle position between the two supply ports. This arrangement can increase the flow velocity at almost the middle position between the two supply ports, and shorten the purge time.

According to still another preferred aspect of the present invention, a direction of the passage may coincide with a flow direction of an ambient atmosphere which flows through the ambient space. This arrangement can suppress a decrease in the concentration of inert gas in the optical path space caused by entry of an ambient atmosphere along with movement of the stage. It is preferable that the passage include a first passage facing an upstream direction of the ambient atmosphere and a second passage facing a downstream direction of the ambient atmosphere, and that the first passage be smaller in section than the second passage. This arrangement can increase the exhaust efficiency while reducing the influence of an ambient atmosphere.

According to still another preferred aspect of the present invention, when the exposure apparatus is applied to a scanning exposure apparatus, a direction of the passage preferably coincides with a moving direction of a stage in scanning exposure. A large amount of inert gas can be supplied in the moving direction of the stage. Thus, this arrangement can suppress a decrease in the concentration of inert gas in the optical path space caused by entry of an ambient atmosphere along with movement of the stage.

According to still another preferred aspect of the present invention, the supply portion preferably supplies inert gas to the optical path space so as to adjust the optical path space to a positive pressure with respect to the ambient space. Gas in the optical path space can be efficiently purged with inert gas.

According to still another preferred aspect of the present invention, the exposure apparatus preferably further comprises an external exhaust portion which is arranged outside the shielding member and recovers and exhausts inert gas leaking from the shielding member. This arrangement can efficiently recover inert gas while maintaining a predetermined pressure in the ambient environment of the exposure apparatus.

According to still another preferred aspect of the present invention, at least part of the shielding member is formed from a member which transmits alignment light. This arrangement can directly exploit a conventional alignment method.

According to still another preferred aspect of the present invention, the exposure apparatus preferably further comprises a substrate stage, a substrate chuck mounted on the substrate stage, and a member which smoothens a change in level between a substrate chucked by the substrate chuck and an ambient portion. This arrangement can suppress an abrupt change in aperture ratio below the optical path space, and increase the exhaust efficiency in the optical path space.

According to still another preferred aspect of the present invention, the shielding member is arranged to surround, e.g., a side plane of an optical path space between a projection optical system and the substrate.

According to still another preferred aspect of the present invention, the shielding member is arranged to surround, e.g., a side plane of an optical path space between an illumination system which illuminates the mask and a mask stage which holds the mask.

According to still another preferred aspect of the present invention, the shielding member is arranged to surround, e.g., a side plane of an optical path space between a mask stage which holds the mask and a projection optical system.

According to still another preferred aspect of the present invention, the shielding member preferably comprises, e.g., a first shielding member which is arranged to surround a side plane of a first optical path space between a projection optical system and the substrate, a second shielding member which is arranged to surround a side plane of a second optical path space between an illumination system which illuminates the mask and a mask stage which holds the mask, and a third shielding member which is arranged to surround a side plane of a third optical path space between the mask stage and the projection optical system.

According to still another preferred aspect of the present invention, the inert gas includes nitrogen gas or helium gas.

According to another aspect of the present invention, there is provided an exposure apparatus which projects and transfers a pattern formed on a mask to a substrate by using exposure light, characterized by comprising a stage, an optical system, a shielding member which surrounds a side plane of an optical path space including a space through which exposure light passes between the stage and the optical system, and a supply portion which supplies inert gas to the optical path space surrounded by the shielding member, wherein an interval between part of an end of the shielding member and the stage is different or made different from an interval between another part of the end of the shielding member and the stage. This arrangement can increase, e.g., the exhaust efficiency of the optical path space and shorten the purge time.

According to a preferred aspect of the present invention, it is preferable that the shielding member include first and second element shielding members arranged to face each other, an interval between the stage and an end of an element shielding member on an upstream side of a flow of an ambient atmosphere out of the first and second element shielding members be relatively small, and an interval between the stage and an end of the other element shielding member on a downstream side of the flow of the ambient atmosphere out of the first and second element shielding members be relatively large. The influence on the optical path space from the upstream side of the flow of the ambient atmosphere can be reduced, and the exhaust efficiency of gas from the optical path space to the downstream side of the flow of the ambient atmosphere can be increased. Inert gas can be maintained at a high concentration in the optical path space, and the time required to purge gas in the optical path space with inert gas can be shortened. According to another preferred aspect of the present invention, the first and second element shielding members are arranged perpendicularly to a flow direction of the ambient atmosphere around the optical path space.

According to still another preferred aspect of the present invention, the exposure apparatus preferably further comprises a driving mechanism which adjusts an interval between the stage and part of the end of the shielding member and an interval between the stage and another part of the end of the shielding member to be different from each other. The exhaust efficiency can be increased in accordance with the moving direction of the stage or the like. In this case, it is preferable that the shielding member include first and second element shielding members arranged to face each other, and the driving mechanism comprise a first driving unit which drives the first element shielding member to adjust an interval between an end of the first element shielding member and the stage, and a second driving unit which drives the second element shielding member to adjust an interval between an end of the second element shielding member and the stage. The interval between the end of the first element shielding member and the stage and the interval between the end of the second element shielding member and the stage can be individually controlled.

According to still another preferred aspect of the present invention, the first and second element shielding members are preferably arranged perpendicularly to a moving direction of the stage. The driving mechanism preferably adjusts the interval between the end of the first element shielding member and the stage and the interval between the end of the second element shielding member and the stage in accordance with a moving direction of the stage. Further, the driving mechanism preferably relatively decreases an interval between the stage and an end of an element shielding member in a moving direction of the stage out of the first and second element shielding members, and relatively increases an interval between the stage and an end of the other element shielding member in a direction opposite to the moving direction of the stage out of the first and second element shielding members. The supply amount of inert gas to a direction from which the stage enters can be increased to suppress a decrease in the concentration of inert gas in the optical path space caused by entry of an ambient atmosphere along with movement of the stage.

According to still another preferred aspect of the present invention, the exposure apparatus preferably further comprises a driving mechanism which adjusts an interval between at least part of the end of the shielding member and the stage in accordance with a moving speed of the stage. Inert gas can be maintained at a high concentration in the optical path space regardless of, e.g., the moving speed of the stage.

According to still another preferred aspect of the present invention, the exposure apparatus preferably further comprises a connection member which connects the shielding member and the optical system. The connection member preferably comprises a structure which maintains airtightness between the shielding member and the optical system. This can prevent, e.g., entrance of an ambient atmosphere into the optical path space.

According to still another preferred aspect of the present invention, the exposure apparatus preferably further comprises a stage controller which controls the stage to adjust an interval between the end of the shielding member and the stage. The stage controller preferably controls the stage so as to set the interval between the end of the shielding member and the stage to a first distance when a predetermined region on the stage enters the optical path space, and then to set the interval to a distance smaller than the first distance. The purge time required to purge gas in the optical path space with inert gas can be shortened, and the inert gas can be maintained at a high concentration after purge.

According to still another preferred aspect of the present invention, the supply portion preferably supplies inert gas to the optical path space so as to adjust the optical path space to a positive pressure with respect to an ambient space. Gas in the optical path space can be efficiently purged with inert gas.

According to still another preferred aspect of the present invention, the exposure apparatus preferably further comprises an external exhaust portion which is arranged outside the shielding member and recovers and exhausts inert gas leaking from the A shielding member. The ambient environment of the exposure apparatus can be maintained at a predetermined pressure, and inert gas can be efficiently recovered.

According to still another preferred aspect of the present invention, at least part of the shielding member is preferably formed from a member which transmits alignment light. In this case, the exposure apparatus can directly use a conventional alignment method.

According to still another preferred aspect of the present invention, the exposure apparatus preferably further comprises a substrate chuck mounted on the stage, and a member which smoothens a change in level between a substrate chucked by the substrate chuck and an ambient portion. An abrupt change in aperture ratio can be suppressed below the optical path space, increasing the exhaust efficiency in the optical path space.

According to still another preferred aspect of the present invention, the shielding member is arranged to surround, e.g., a side plane of an optical path space between a projection optical system and the substrate.

According to still another preferred aspect of the present invention, the shielding member is arranged to surround, e.g., a side plane of an optical path space between the optical system serving as an illumination system which illuminates the mask and a mask stage which holds the mask.

According to still another preferred aspect of the present invention, the shielding member is arranged to surround, e.g., a side plane of an optical path space between a mask stage which holds the mask and the optical system serving as a projection optical system.

According to still another preferred aspect of the present invention, the shielding member comprises, e.g., a first shielding member which is arranged to surround a side plane of a first optical path space between a first optical system serving as a projection optical system and the substrate, a second shielding member which is arranged to surround a side plane of a second optical path space between a second optical system serving as an illumination system which illuminates the mask and a mask stage which holds the mask, and a third shielding member which is arranged to surround a side plane of a third optical path space between the mask stage and the first optical system serving as the projection optical system.

According to still another preferred aspect of the present invention, the inert gas includes nitrogen gas or helium gas.

According to still another aspect of the present invention, there is provided an exposure apparatus which projects and transfers a pattern formed on a mask to a substrate by using exposure light, characterized by comprising a stage, an optical system, a shielding member which surrounds a side plane of an optical path space including a space through which exposure light passes between the stage and the optical system, a supply portion which supplies inert gas to the optical path space surrounded by the shielding member, and a driving mechanism which dynamically adjusts an interval between at least part of an end of the shielding member and the stage while vertically driving the stage in horizontally driving the stage.

A device manufacturing method according to the present invention comprises the steps of transferring a pattern to a substrate coated with a photosensitive material by using any one of the above-described exposure apparatuses, and developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a plan view when viewed downward from the line B–B' in FIG. 6;

DETAILED DESCRIPTION OF THE PREFERRED EMBODIMENTS

Preferred embodiments of the present invention will be described below with reference to the accompanying drawings.

[First Embodiment]

Figure 1:
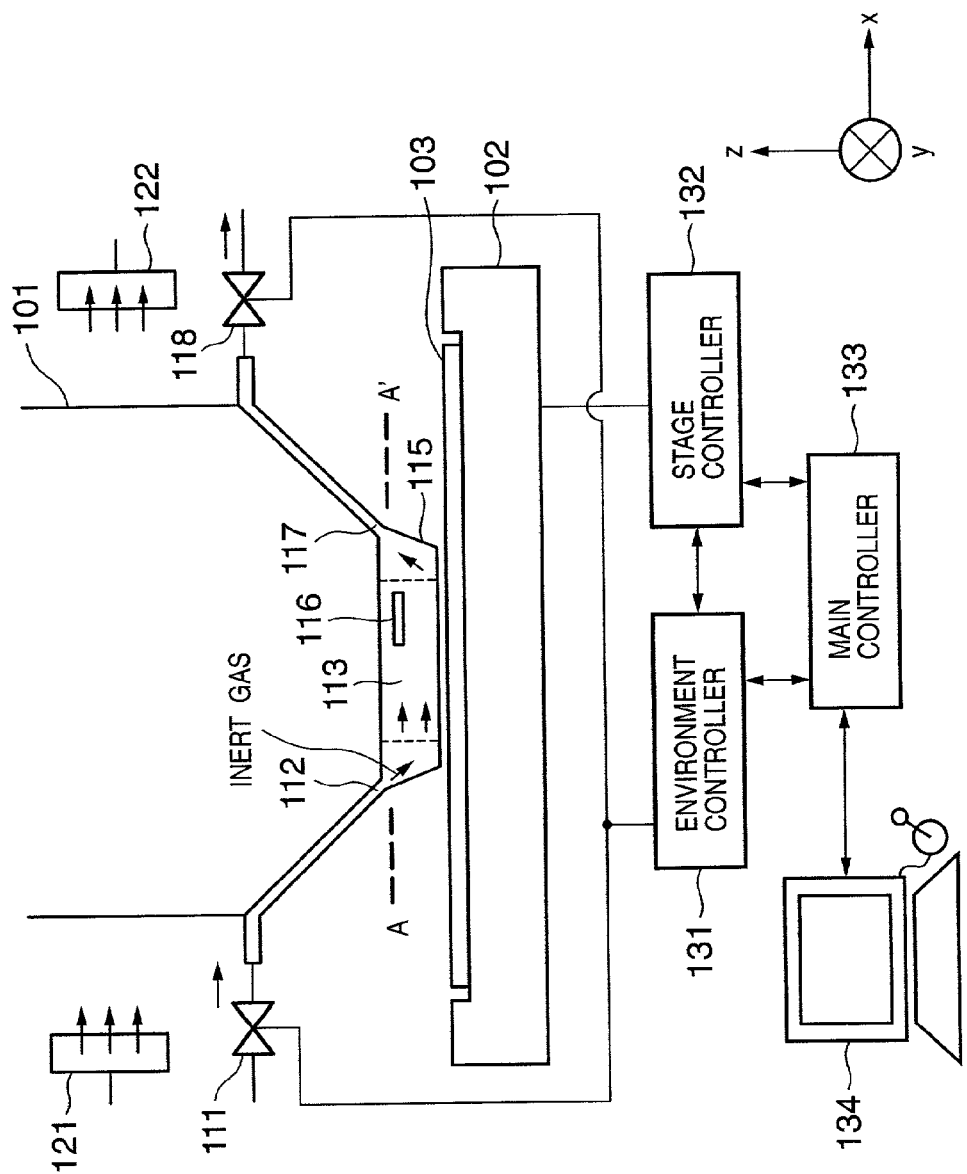
FIG. 1 is a view showing part of an exposure apparatus according to the first embodiment of the present invention.
Figure 2:
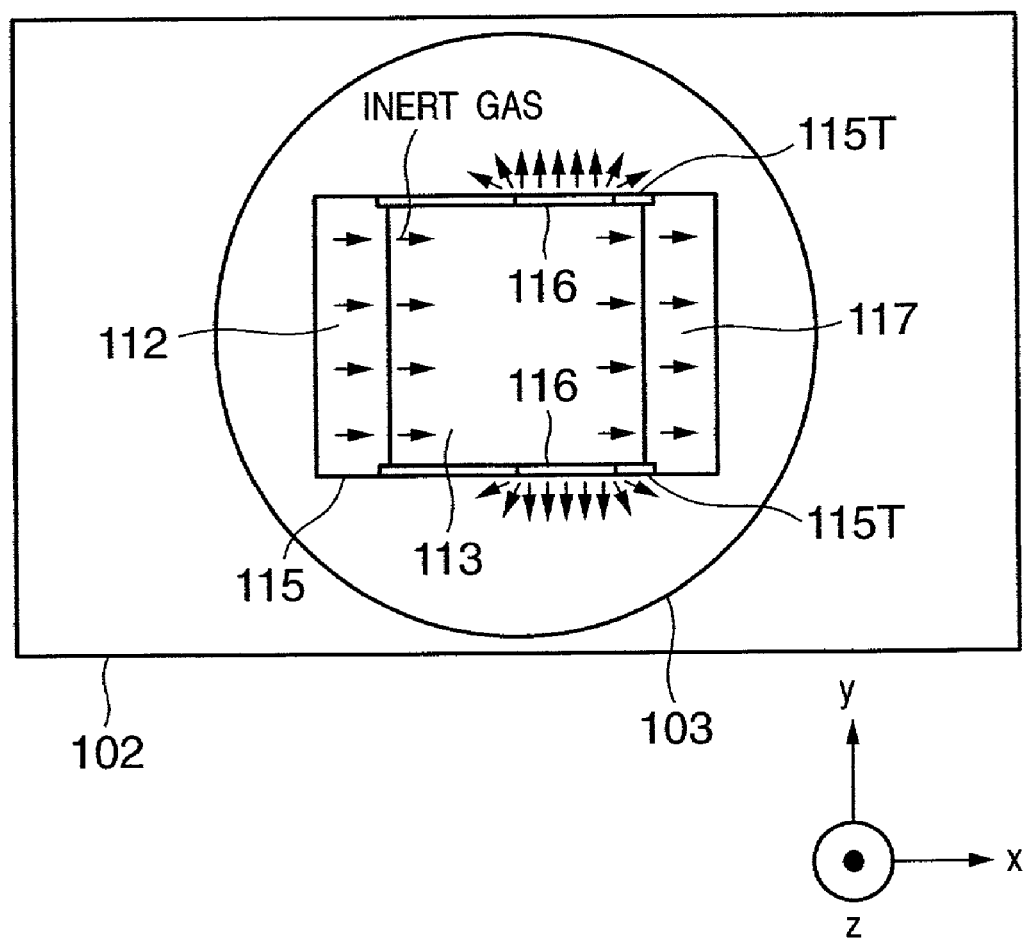
FIG. 2 is a plan view when viewed downward from the line A–A' in FIG. 1.

FIGS. 1 and 2 are views showing part of an exposure apparatus according to the first embodiment of the present invention. FIG. 1 is a schematic view showing the lower part of the projection optical system (lens barrel) of the exposure apparatus, the vicinity of a wafer, and a control system. FIG. 2 is a plan view when viewed downward from the line A–A' in FIG. 1.

The exposure apparatus comprises a light source (not shown), such as an $F_2$ excimer laser, which generates a short-wavelength laser beam as illumination light. Illumination light (exposure light) generated by the light source uniformly illuminates a reticle (mask) via a proper illumination optical member. Light (exposure light) having passed through the reticle reaches the surface of a wafer 103 set on a wafer stage 102 via various optical members which constitute a projection optical system 101. The light forms the reticle pattern image on the surface of the wafer 103.

The wafer stage 102 which supports the wafer 103 is movable three-dimensionally (X, Y, and Z directions). The reticle pattern is sequentially projected and transferred onto the wafer 103 by, e.g., a so-called step & repeat method of repeating stepping movement and exposure. This arrangement is almost the same when the present invention is applied to a scanning exposure apparatus.

In exposure, temperature-controlled inert gas (e.g., nitrogen gas or helium gas) is supplied via an air supply valve 111 and air supply port 112 to a space (to be referred to as an optical path space hereinafter) 113 including a space through which exposure light passes and a vicinity of that space between the wafer 103 and an optical member (to be referred to as a final optical member hereinafter) on the final stage of the projection optical system 101. Part of inert gas supplied to the optical path space 113 is recovered at an exhaust port 117 and exhausted via an exhaust valve 118. As shown in FIGS. 1 and 2, the air supply port 112 and exhaust port 117 are arranged at positions opposite to each other via the exposure region (optical path space). Note that arrows in FIGS. 1 and 2 indicate flows of inert gas.

Shielding members 115 are attached to the lower portion of the projection optical system 101 so as to surround the side planes of the optical path space 113 in order to separate the optical path space 113 from an ambient atmosphere. The lower portion of each shielding member 115 has an opening for transmitting exposure light. The shielding member 115 is so arranged as to define a predetermined interval between the shielding member 115, the wafer 103, and the wafer stage 102. This interval makes the optical path space 113 communicate with an ambient space. At least part of the shielding member 115 is made of a transparent member 115T in order to transmit alignment light.

A temperature-controlled gas is supplied outside of the optical path space 113 from a second air supply port 121. The gas supplied outside of the optical path space 113 is recovered and exhausted by a second exhaust port 122. The gas supplied from the second air supply port can be air, or inert gas having a low concentration compared to that of inert gas supplied from the air supply port 112.

To adjust the optical path space 113 to a positive pressure with respect to the ambient atmosphere, the amount of inert gas recovered by the exhaust port 112 is set to be smaller than that of inert gas supplied from the air supply port 112. Inert gas which leaks from the optical path space 113 to the ambient space via the interval between the wafer 103 and the shielding member 115 below the projection optical system 101 is recovered and exhausted by a second exhaust port 122 together with an ambient atmosphere supplied from a second air supply port 121.

Opening/closing of the valves 111 and 118 and their opening degrees are controlled by an environment controller 131, whereas the stage 102 is controlled by a stage controller 132. The controllers 131 and 132 and other controllers (not shown) are comprehensively controlled by a main controller 133 in various operations such as wafer exchange, alignment operation, and exposure operation. The control contents of the main controller 133 and the operation state of the exposure apparatus are monitored by a monitoring device 134.

In wafer exchange, the oxygen concentration in the optical path space 113 greatly increases under the influence of the ambient atmosphere. Since the flow path between the ambient space and the optical path space 113 depends on the lower side of the optical path space 113, the atmosphere is hardly purged by inert gas supplied from the air supply port 112 at the upper portion and downstream side of the optical path space 113. At these portions, the purge time tends to be long.

The first embodiment, therefore, shortens the purge time at the upper portion and downstream side of the optical path space 113 by forming passages (openings) 116 in the shielding members 115 at the upper portion and downstream side of the optical path space 113, as shown in FIGS. 1 and 2. In the first embodiment, the passages are formed at the upper portion and downstream side of the optical path space 113.

The same effects can also be obtained by forming, e.g., a slit-like passage in the entire upper portion of the shielding member 115.

Shutters or valves (not shown) may be attached to the openings 116, and opened only when the internal atmosphere of the optical path space 113 is to be purged, for example, when the wafer stage 102 is to enter the space 113. This can increase the exhaust efficiency in the optical path space 113. After entry of the wafer stage 102 is completed, or before or after purge of the internal atmosphere of the optical path space 113 with inert gas is completed, the shutters or valves are closed to restrict the flow of the internal atmosphere of the optical path space 113 to the lower portion of the optical path space 113 between the exhaust port 117, the wafer 103, and the shielding member 115. In this case, the consumption amount of inert gas can be suppressed while the concentration of inert gas in the optical path space 113 is maintained. The openings 116 do not have a device for sucking the gas in the optical path space 113 unlike a usual gas exhaust portion. Effective opening sizes of the openings 116 can be adjusted by manipulating or controlling the shutters or valves.

[Second Embodiment]

Figure 3:
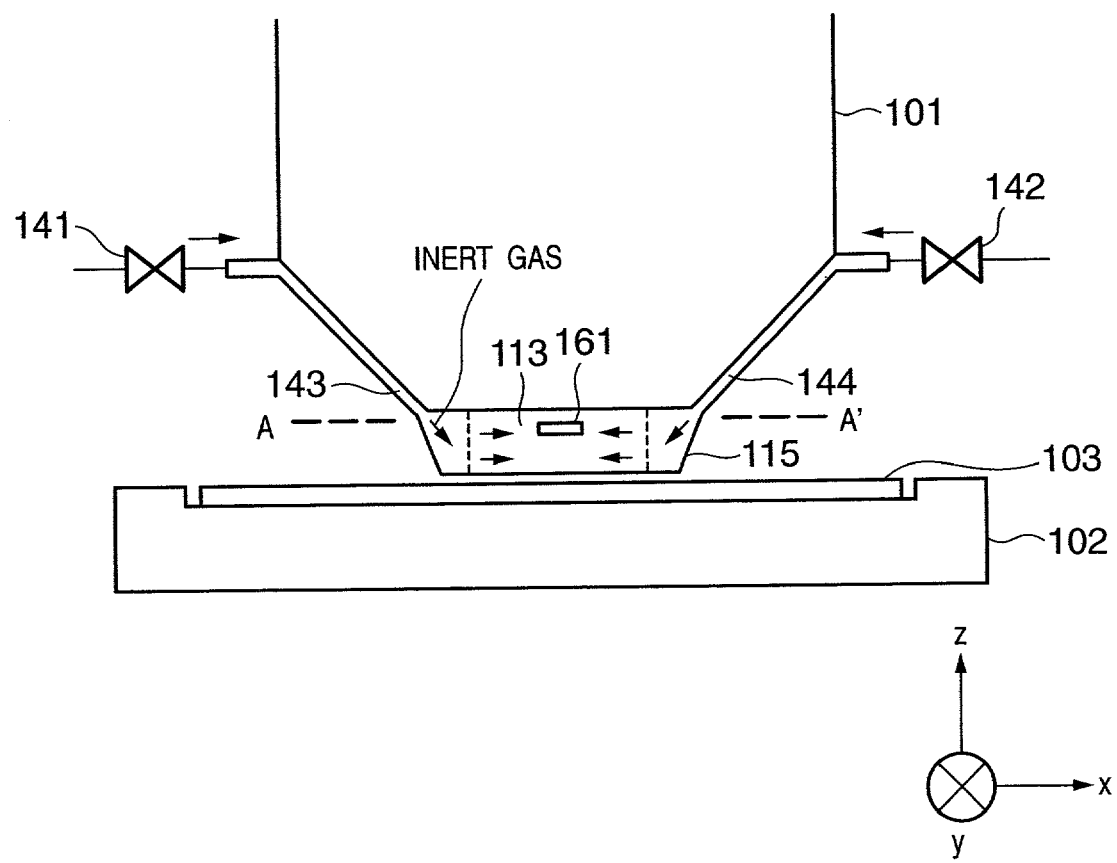
FIG. 3 is a view showing part of an exposure apparatus according to the second embodiment of the present invention.
Figure 4:
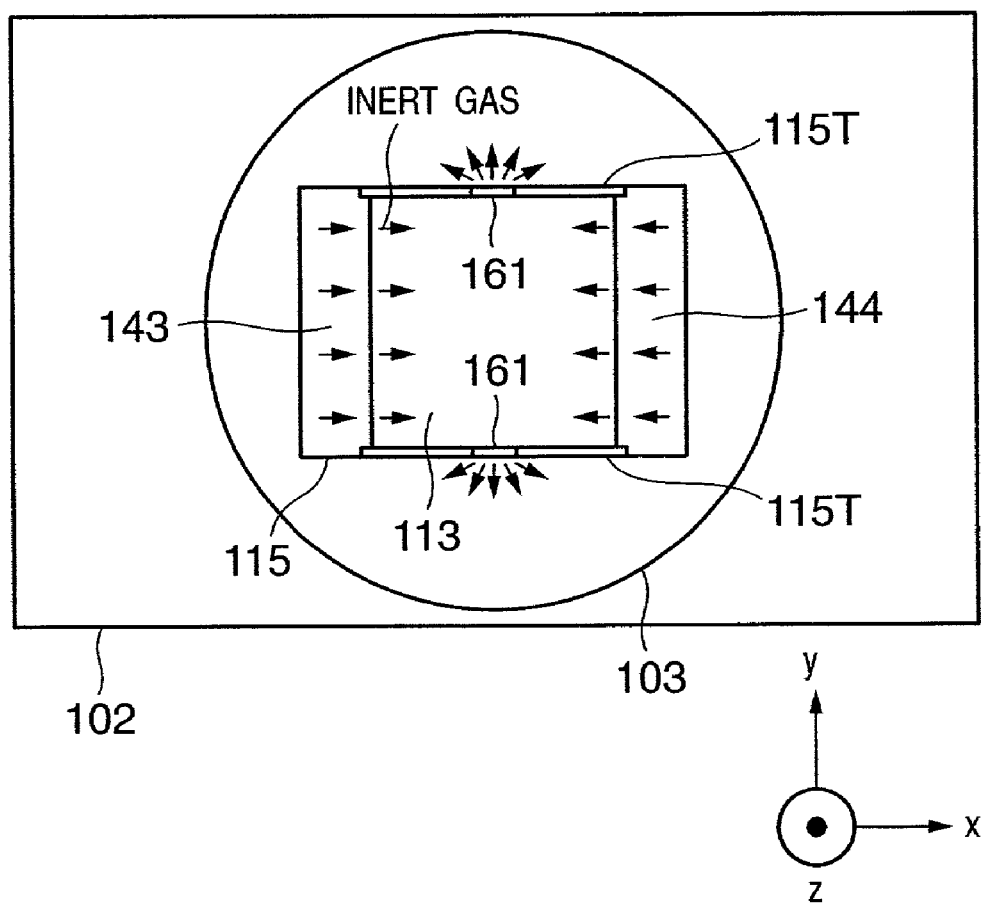
FIG. 4 is a plan view when viewed downward from the line A–A' in FIG. 3.

FIGS. 3 and 4 are views showing part of an exposure apparatus according to the second embodiment of the present invention. FIG. 3 is a schematic view showing the lower part of the projection optical system (lens barrel) of the exposure apparatus and the vicinity of a wafer. FIG. 4 is a plan view when viewed downward from the line A–A' in FIG. 3. FIG. 3 does not illustrate building components 131 to 134 in FIG. 1 for descriptive convenience.

In the second embodiment, first and second air supply ports 143 and 144 which supply inert gas to an optical path space 113 are arranged at positions opposite to each other via the exposure region (optical path space). The optical path space 113 receives inert gas via a first air supply valve 141 and the first air supply port 143, and via a second air supply valve 142 and the second air supply port 144 arranged at a position opposite to the first air supply port 143.

When the first and second air supply ports 143 and 144 are arranged at opposite positions, the flow velocity tends to decrease near the midpoint between these ports and increase the inert gas concentration near the midpoint depending on the supply flow rates of inert gas from the two air supply ports. This is because inert gases supplied from the two air supply ports collide against each other when their supply flow rates are almost the same.

From this, the second embodiment shortens the purge time near the midpoint by forming a pair of facing passages 161 in portions of shielding members 115 near the midpoint between the first and second air supply ports 143 and 144. If the flow velocity of inert gas is different between the two air supply ports 143 and 144, it is preferable to obtain a place where the flow velocity decreases on the basis of, e.g., the air supply amount ratio of inert gas from these air supply ports, and to form the passage 161 at this place. The same effects can also be obtained by forming, e.g., a slit-like passage 161 in the entire upper portion of the shielding member 115, similar to the first embodiment.

The same effects can also be obtained by forming, e.g., a slit-like passage 161 in the entire upper portion of the shielding member 115, similar to the first embodiment.

In a general exposure apparatus, a temperature-controlled atmosphere is supplied around the optical path space in order to control the temperature of a stage or the like and suppress stagnation of an atmosphere. When a passage is formed in the shielding member 115 toward the upstream of the flow of the ambient atmosphere, e.g., when the flow direction of the ambient atmosphere coincides with the direction (through direction) of the passage, the ambient atmosphere may enter the optical path space 113 from the passage.

Figure 5:
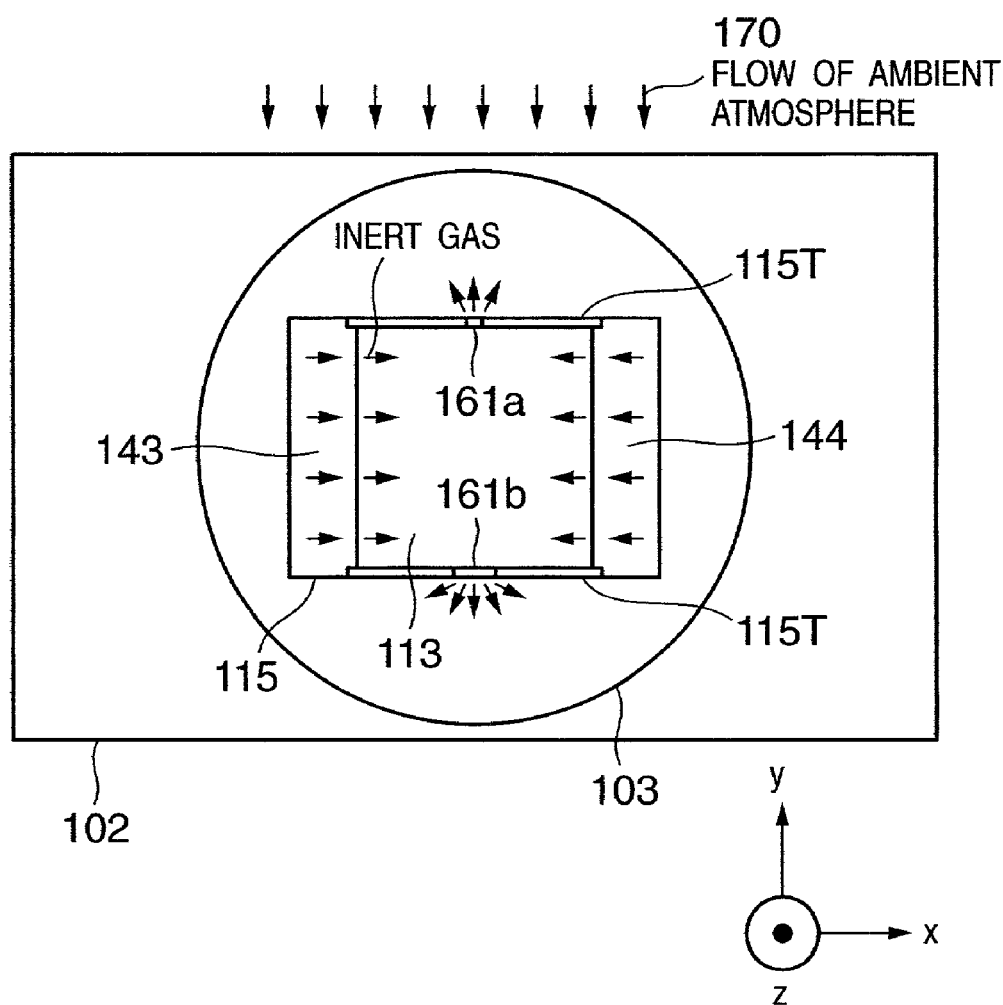
FIG. 5 is a plan view showing a modification of the second embodiment of the present invention.

To prevent this, an upstream passage 161a is downsized enough to eliminate the influence of the ambient atmosphere, as shown in FIG. 5. This structure can eliminate the influence of the ambient atmosphere while increasing the exhaust efficiency in the optical path space 113. The upstream passage 161a may be omitted, and a passage 161b may be arranged on only the downstream side, which can further suppress the influence of the flow of the ambient atmosphere.

When the second embodiment is applied to a scanning exposure apparatus, the passage is effectively arranged such that the direction (through direction) of the passage coincides with a direction parallel to the scanning direction. Since inert gas is exhausted via the passage in the scanning direction of a wafer 103, the inert gas concentration around the passage can be increased. This can suppress a decrease in the concentration of inert gas in the optical path space 113 caused by entry of the ambient atmosphere in stage operation.

[Third Embodiment]

Figure 6:
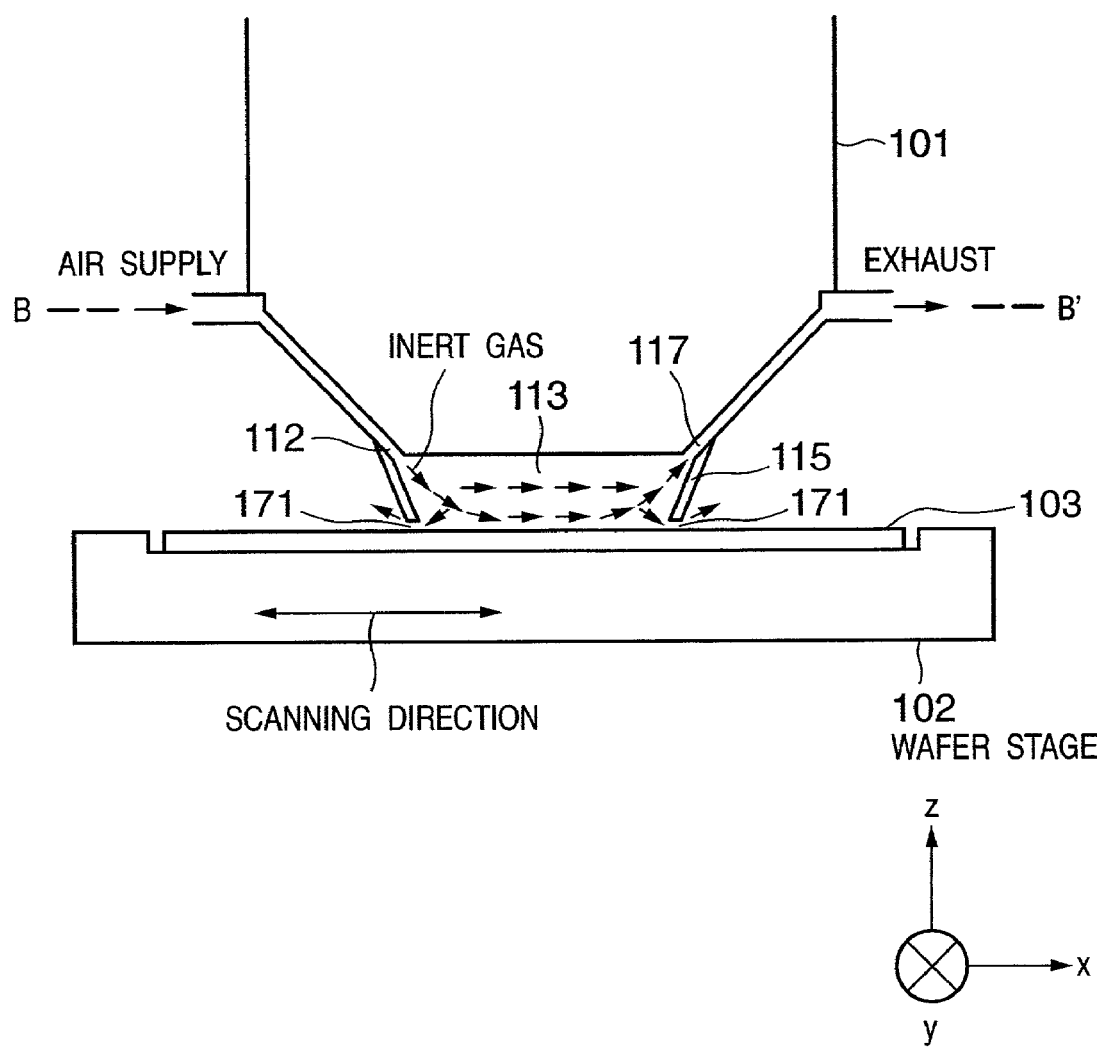
FIG. 6 is a view showing part of an exposure apparatus according to the third embodiment of the present invention.
Figure 8:
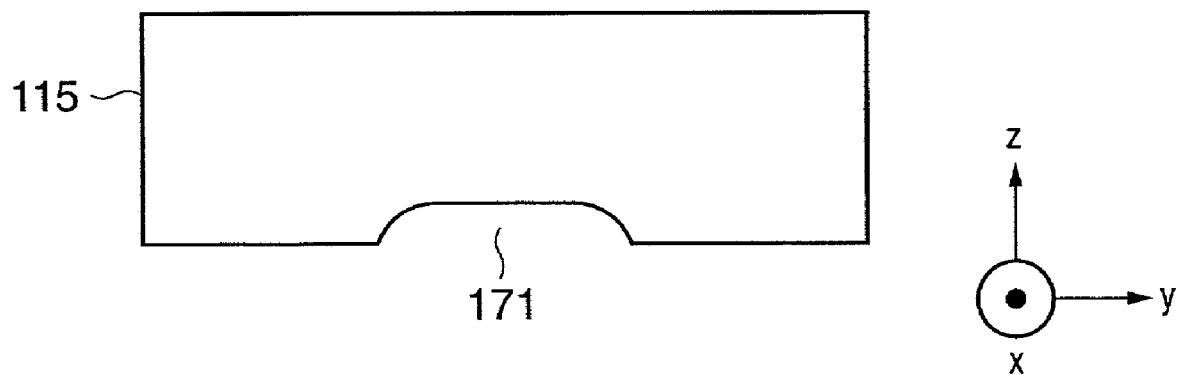
FIG. 8 is a view showing a shielding member according to the third embodiment of the present invention.

FIGS. 6 to 8 are views showing part of an exposure apparatus according to the third embodiment of the present invention. FIG. 6 is a schematic view showing the lower part of the projection optical system (lens barrel) of the exposure apparatus and the vicinity of a wafer. FIG. 7 is a plan view when viewed downward from the line B–B' in FIG. 6. FIG. 8 is a view showing the structure of a shielding member. FIG. 6 does not illustrate building components 131 to 134 in FIG. 1 for descriptive convenience.

The first and second embodiments shorten the purge time by forming a passage (opening) at the upper portion of a shielding member. The structure in which the passage is formed at the upper portion of the shielding member is preferable for shortening the exhaust time, but is readily influenced by an ambient atmosphere. In the third embodiment, a passage is formed at the lower portion of a shielding member instead of forming the passage at the upper portion of the shielding member.

In the third embodiment, as shown in FIG. 6, exhaust passages 171 are formed in a surface having an inert gas supply port 112 and a surface having an inert gas exhaust port 117 out of shielding members 115 on four sides. FIG. 8 shows an example of the exhaust passage 171 formed at the lower portion of the shielding member 115.

Since the passage 171 is formed at the lower portion of the shielding member 115, the exhaust efficiency of inert gas becomes lower than those in the first and second embodiments, but the influence of the ambient atmosphere can be reduced. When the third embodiment is applied to a scanning exposure apparatus, the passage 171 is so formed as to exhaust inert gas in the scanning direction (i.e., so as to coincide with the scanning direction). A larger amount of inert gas can be supplied in the scanning direction to suppress a decrease in the concentration of inert gas in an optical path space 113 caused by entry of the ambient atmosphere in the operation of a wafer stage 102. In this case, the direction of inert gas from the supply port 112 to the exhaust port 117 coincides with the scanning direction.

Thus, the difference in the concentration of inert gas in a direction perpendicular to the scanning direction can be reduced.

[Fourth Embodiment]

Figure 9:
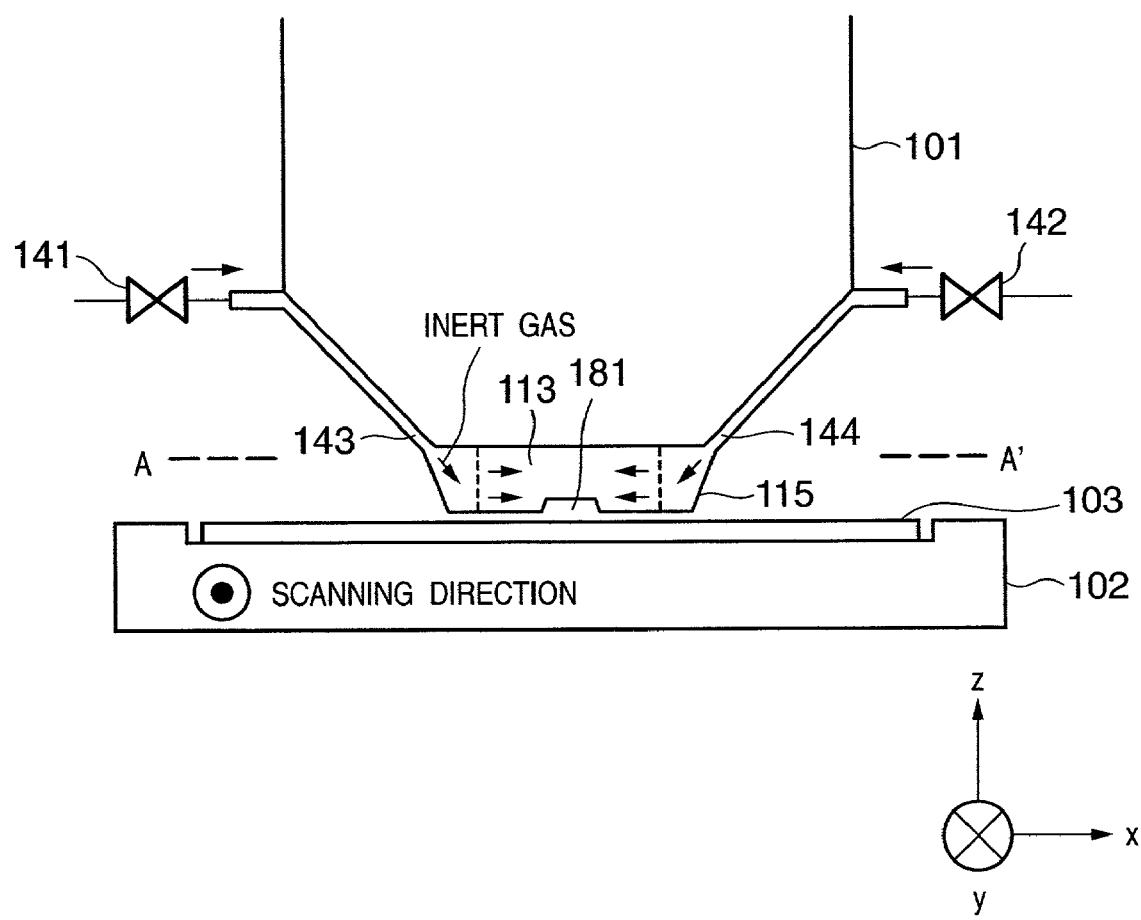
FIG. 9 is a view showing part of an exposure apparatus according to the fourth embodiment of the present invention.
Figure 10:
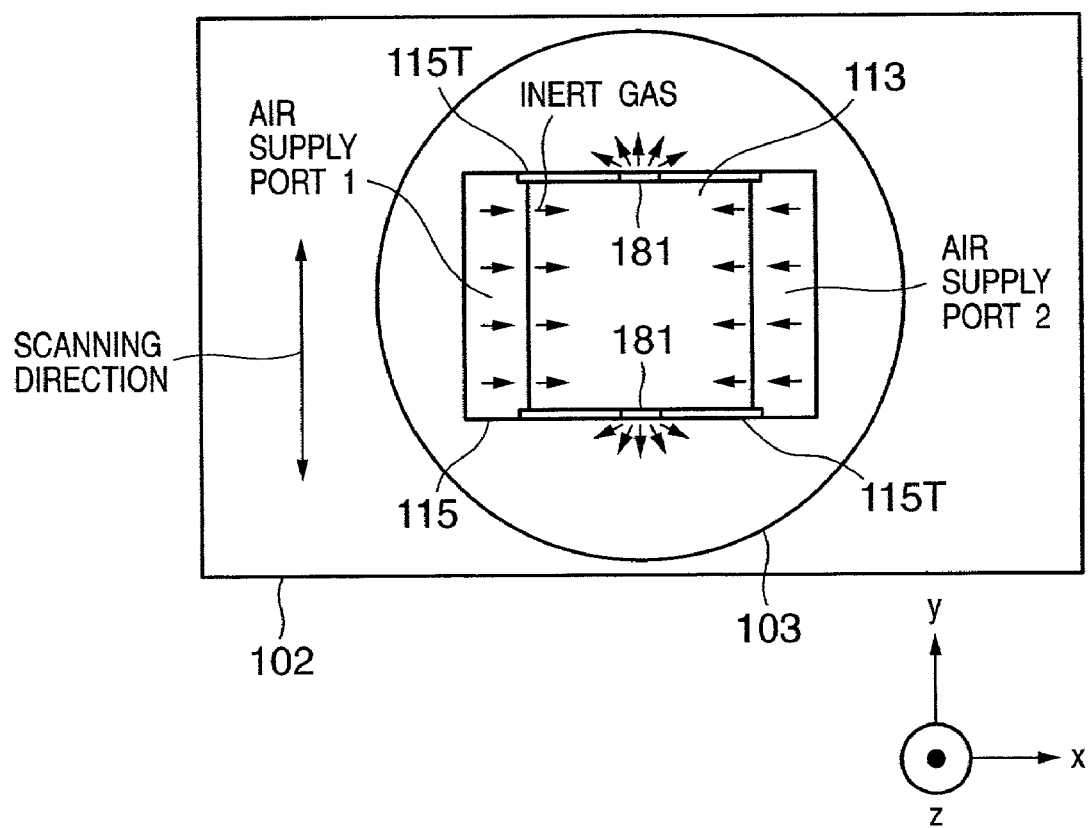
FIG. 10 is a plan view when viewed downward from the line A–A' in FIG. 9.

FIGS. 9 and 10 are views showing part of an exposure apparatus according to the fourth embodiment of the present invention. FIG. 9 is a schematic view showing the lower part of the projection optical system (lens barrel) of the exposure apparatus and the vicinity of a wafer. FIG. 10 is a plan view when viewed downward from the line A–A' in FIG. 9. FIG. 9 does not illustrate building components 131 to 134 in FIG. 1 for descriptive convenience. In the fourth embodiment, similar to the third embodiment, a passage is formed at the lower portion of a shielding member.

In the fourth embodiment, first and second air supply ports 143 and 144 which supply inert gas to an optical path space 113 are arranged at positions opposite to each other via the exposure region. The optical path space 113 receives inert gas via a first air supply valve 141 and the first air supply port 143, and via a second air supply valve 142 and the second air supply port 144 arranged at a position opposite to the first air supply port 143.

In the fourth embodiment, facing passages 181 are formed at a portion of a shielding member 115 near the midpoint between the first and second air supply ports 143 and 144 and the lower portion of the shielding member 115. This structure increases the exhaust efficiency near the midpoint and reduces the influence of an ambient atmosphere.

When the fourth embodiment is applied to a scanning exposure apparatus, the passages 181 are so arranged as to exhaust inert gas in the scanning direction. A larger amount of inert gas can be supplied in the scanning direction to suppress a decrease in the concentration of inert gas in an optical path space 113 caused by entry of the ambient atmosphere in the operation of a wafer stage 102.

[Fifth Embodiment]

Figure 11:
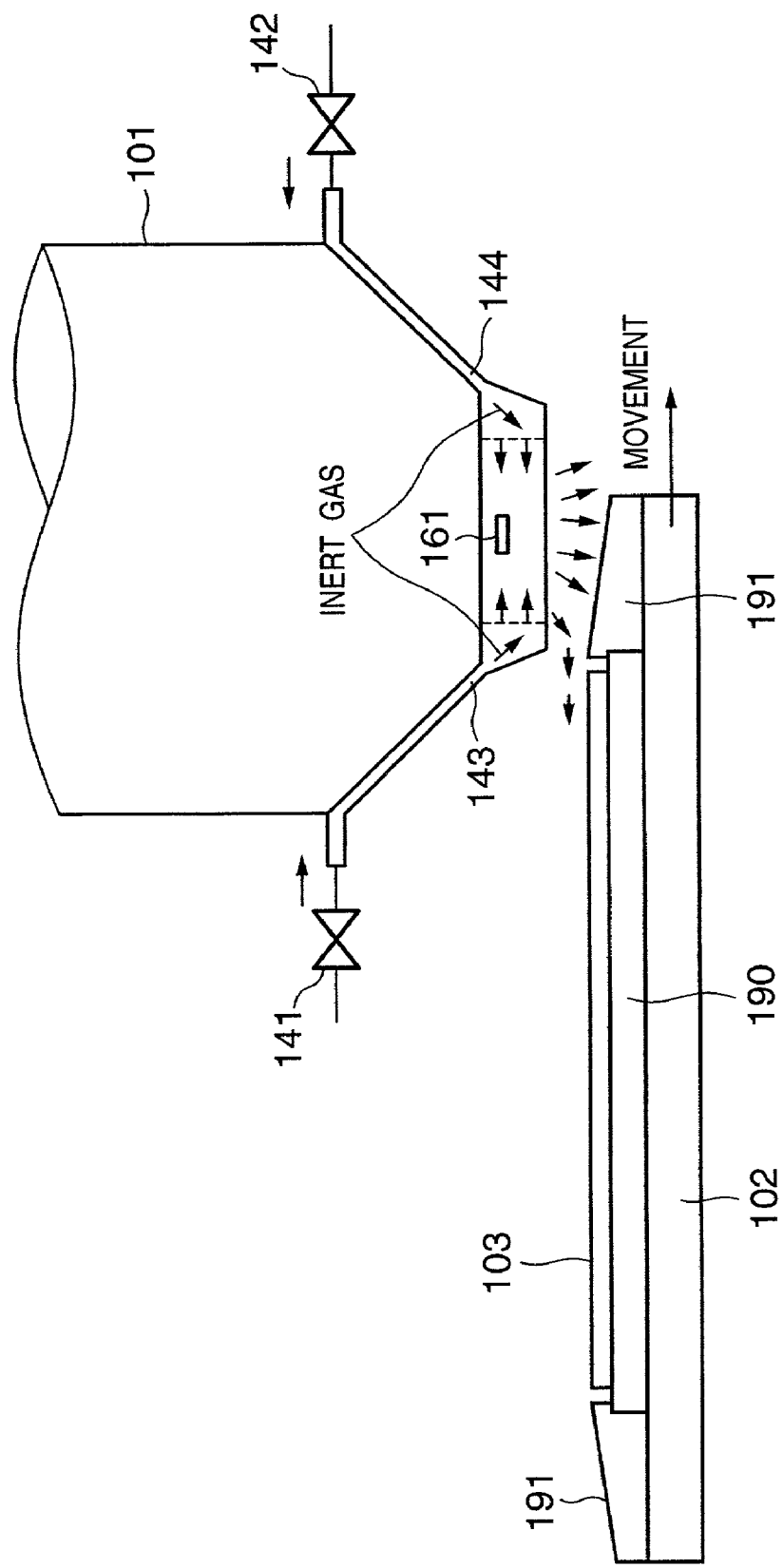
FIG. 11 is a view showing part of an exposure apparatus according to the fifth embodiment of the present invention.

FIG. 11 is a view showing part of an exposure apparatus according to the fifth embodiment of the present invention. The fifth embodiment achieves a shorter purge time by adding the following arrangement to the first to fourth embodiments.

A level adjustment plate with a slope sufficient enough to smoothen a change in level between a wafer 103 and a surrounding portion is arranged around the wafer 103 on a wafer stage 102. A level adjustment plate 191 suppresses an abrupt change (decrease) in aperture ratio below an optical path space 113 when the wafer 103 enters the optical path space 113. Thus, the level adjustment plate 191 increases the exhaust efficiency of the optical path space 113.

The fifth embodiment further increases the exhaust efficiency in a system (e.g., second embodiment) in which air supply ports 143 and 144 are arranged at opposite positions. This improvement can also be applied to another system (e.g., first, third, or fourth embodiment).

[Sixth Embodiment]

Figure 12:
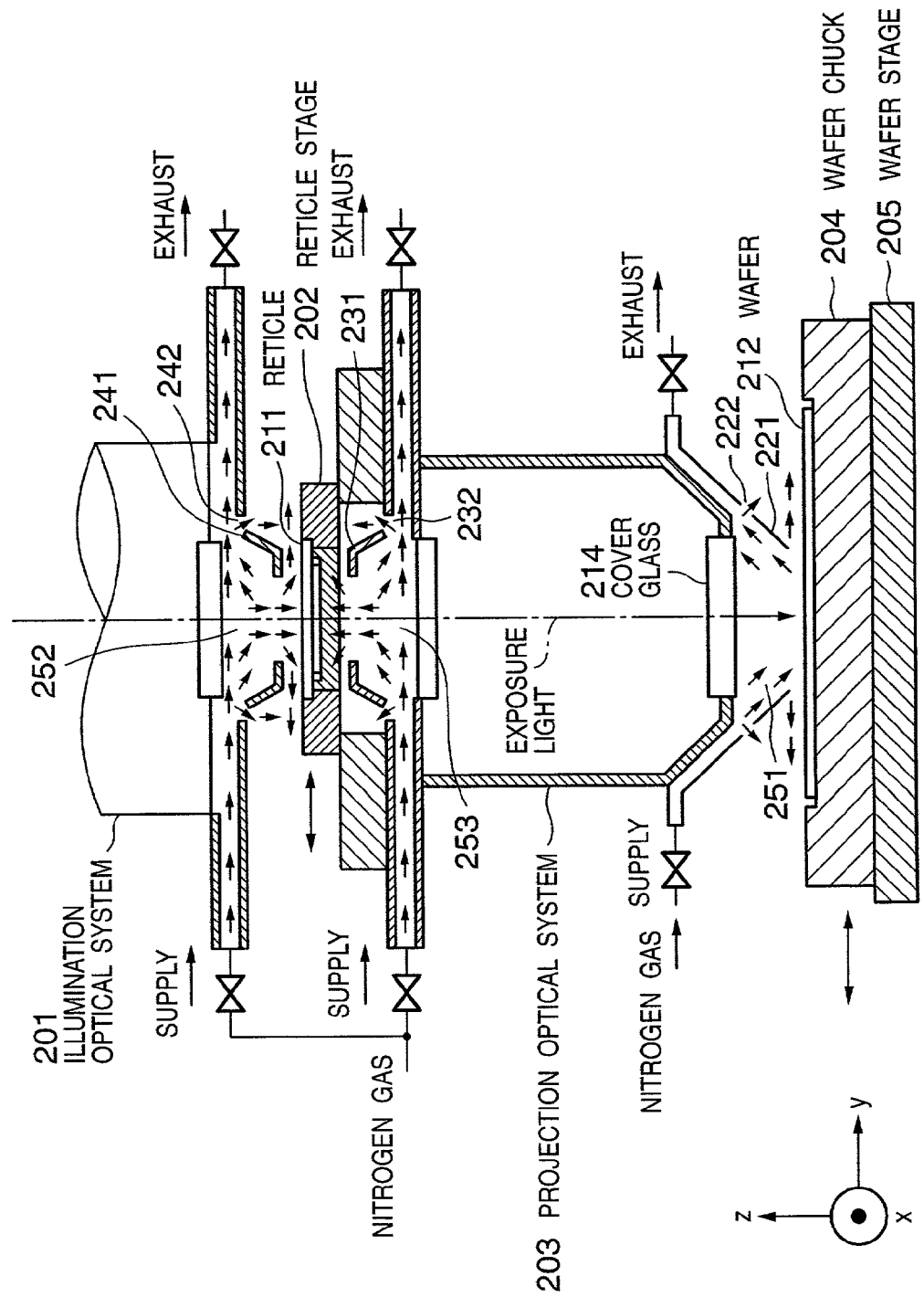
FIG. 12 is a schematic view showing the arrangement of an exposure apparatus according to the sixth embodiment of the present invention.
Figure 13:
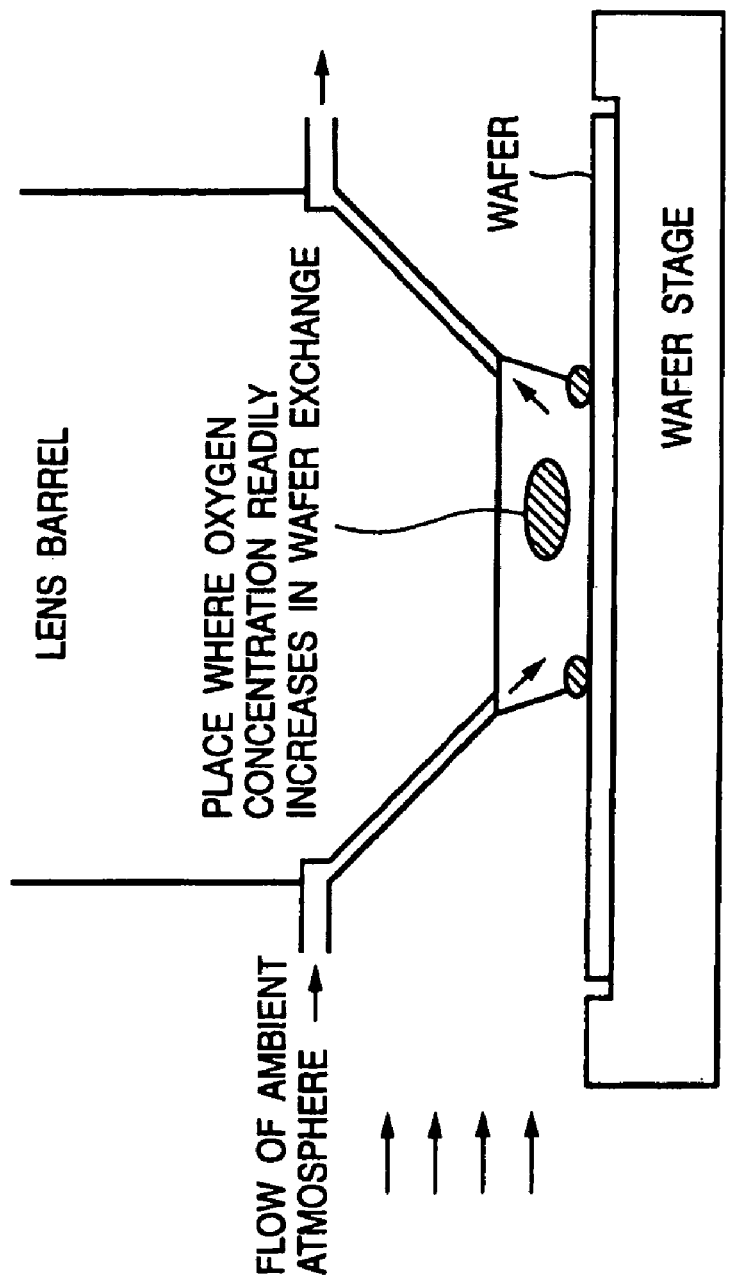
FIG. 13 is a view for explaining the problem of a conventional exposure apparatus.

The inventions applied between the projection optical system and the wafer stage in the first to fifth embodiments can also be applied between the illumination optical system and the reticle stage and between the reticle stage and the projection optical system. FIG. 12 is a sectional view showing an exposure apparatus in which the present invention is applied between the projection optical system and the wafer stage, between the illumination optical system and the reticle stage, and between the reticle stage and the projection optical system.

In the exposure apparatus shown in FIG. 12, first shielding members 221 are so arranged as to surround the side planes of a first optical path space 251 between a final optical member (cover glass) 214 of a projection optical system 203 and a wafer chuck 204 (wafer 212). In this exposure apparatus, second shielding members 241 are so arranged as to surround the side planes of a second optical path space 252 between a reticle stage 202 (reticle 211) and an illumination optical system 201 which illuminates the reticle (mask) 211. In the exposure apparatus, third shielding members 231 are so arranged as to surround the side planes of a third optical path space 253 between the reticle stage 202 and the projection optical system 203. Passages 222 are formed in the first shielding members 221; passages 242, in the second shielding members 241; and passages 232, in the third shielding members 231.

Inert gas (e.g., nitrogen gas or helium gas) is supplied to the first to third optical path spaces.

In FIG. 12, the reticle stage is controlled by a stage controller in synchronism with the wafer stage, and each valve is controlled by an environment controller. Each controller is comprehensively controlled by a main controller.

[Seventh Embodiment]

Figure 16:
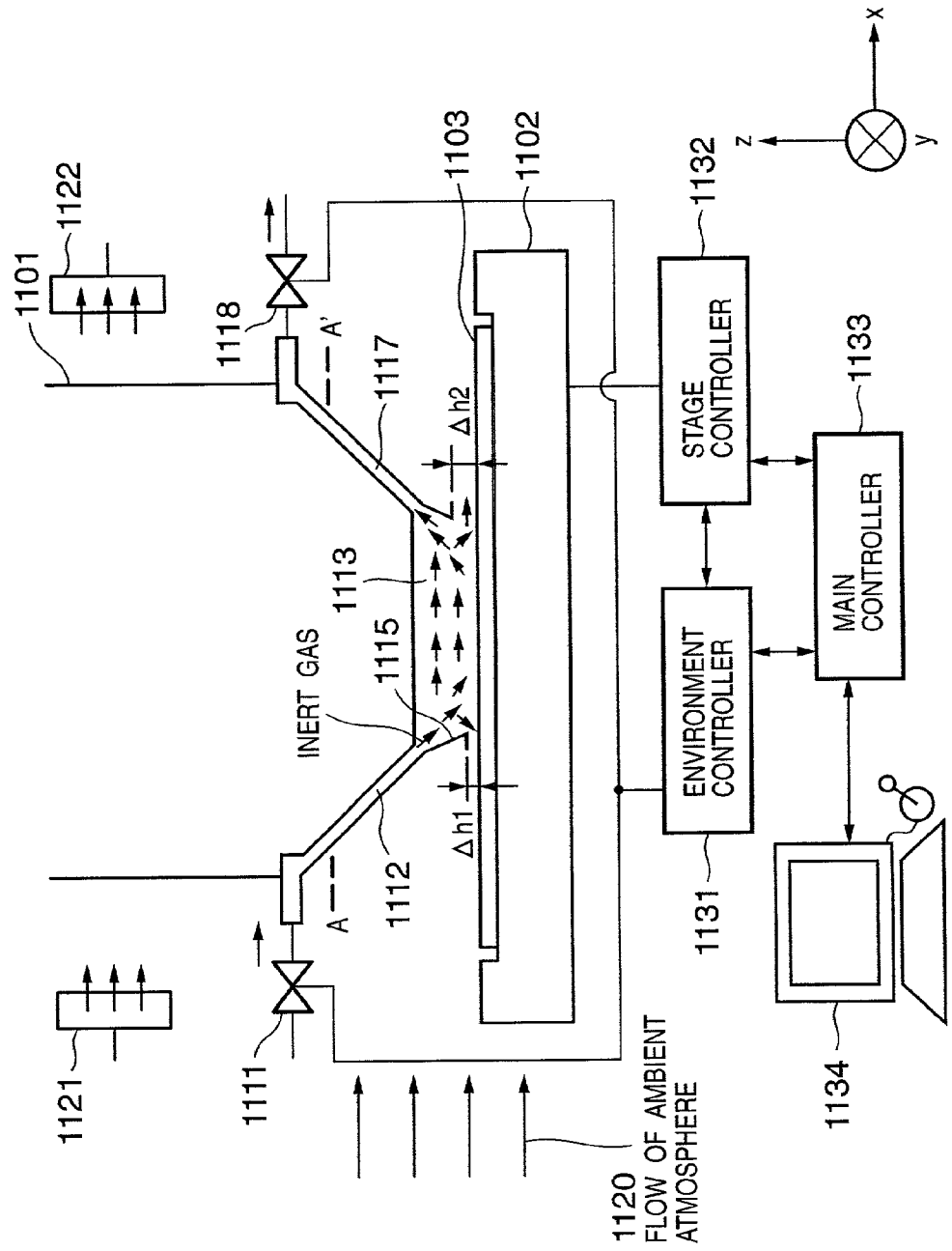
FIG. 16 is a view showing part of an exposure apparatus according to the seventh embodiment of the present invention.
Figure 17:
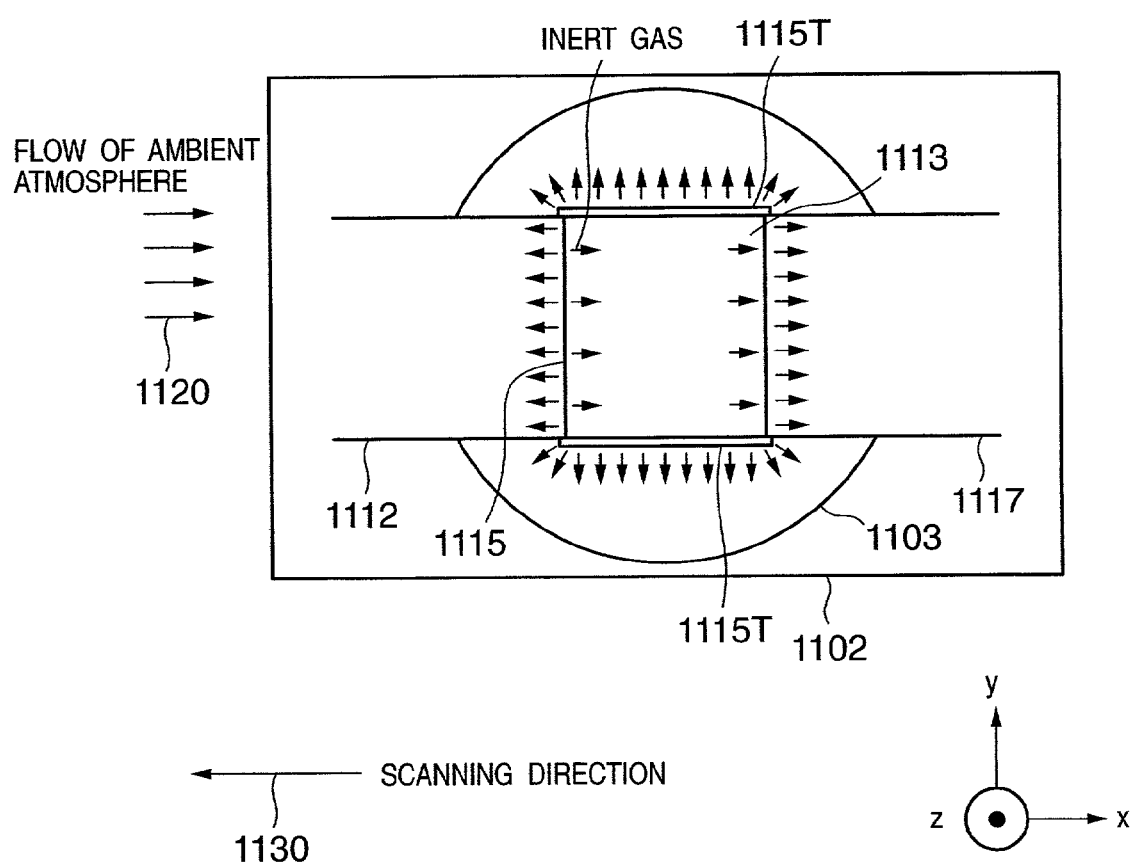
FIG. 17 is a plan view when viewed downward from the line A–A' in FIG. 16.

FIGS. 16 and 17 are views showing part of an exposure apparatus according to the seventh embodiment of the present invention. FIG. 16 is a schematic view showing the lower part of the projection optical system (lens barrel) of the exposure apparatus, the vicinity of a wafer, and a control system. FIG. 17 is a plan view when viewed downward from the line A–A' in FIG. 16.

The exposure apparatus comprises a light source (not shown), such as an $F_2$ excimer laser, which generates a short-wavelength laser beam as illumination light. Illumination light (exposure light) generated by the light source uniformly illuminates a reticle (mask) via a proper illumination optical member. Light (exposure light) having passed through the reticle reaches the surface of a wafer 1103 set on a wafer stage 1102 via various optical members which constitute a projection optical system 1101. The light forms the reticle pattern on the surface of the wafer 1103.

The wafer stage 1102 which supports the wafer 1103 is movable three-dimensionally (X, Y, and Z directions). The reticle pattern is sequentially projected and transferred onto the wafer 1103 by, e.g., a so-called step & scanning method of repeating stepping movement and scanning exposure. This arrangement is almost the same when the present invention is applied to a stepping & repeat exposure apparatus.

In exposure, temperature-controlled inert gas (e.g., nitrogen gas or helium gas) is supplied via an air supply valve 1111 and air supply port 1112 to a space (to be referred to as an optical path space hereinafter) 1113 including a space through which exposure light passes and a vicinity of that space between the wafer 1103 and the final optical member of the projection optical system 1101. Part of inert gas supplied to the optical path space 1113 is recovered at an exhaust port 1117 and exhausted via an exhaust valve 1118. As shown in FIGS. 16 and 17, the air supply port 1112 and exhaust port 1117 are arranged at positions opposite to each other via the exposure region (optical path space). Note that arrows in FIGS. 16 and 17 indicate flows of inert gas.

Shielding members 1115 are attached to the lower portion of the projection optical system 1101 so as to surround the side planes of the optical path space 1113 in order to separate the optical path space 1113 from an ambient atmosphere.

The lower portion of each shielding member 1115 has an opening for transmitting exposure light. An interval is set between the lower end of the shielding member 1115, the wafer 1103, and the wafer stage 1102. At least part of the shielding member 1115 is made of a transparent member 1115T which transmits alignment light.

A temperature-controlled gas is supplied to outside of the optical path space 1113 from a second air supply port 1121. The gas supplied outside of the optical path space 1113 is recovered and exhausted by a second exhaust port 1122. The gas supplied from the second air supply port can be air, or inert gas having a low concentration compared to that of inert gas supplied from the air supply port 1112.

To adjust the optical path space 1113 to a positive pressure with respect to the ambient atmosphere, the amount of inert gas recovered by the exhaust port 1117 is set to be smaller than that of inert gas supplied from the air supply port 1112. Inert gas which leaks from the optical path space 1113 to the ambient space via the interval between the wafer 1103 and the lower end of the shielding member 1115 below the projection optical system 1101 is recovered and exhausted by a second exhaust port 1122 together with an ambient atmosphere supplied from a second air supply port 1121.

Opening/closing of the valves 1111 and 1118 and their opening degrees are controlled by an environment controller 1131, whereas the stage 1102 is controlled by a stage controller 1132. The controllers 1131 and 1132 and other controllers (not shown) are comprehensively controlled by a main controller 1133 in various operations such as wafer exchange, alignment operation, and exposure operation. The control contents of the main controller 1133 and the operation state of the exposure apparatus are monitored by a monitoring device 1134.

A flow path which connects the optical path space 1113 and the ambient atmosphere exists on the lower side of the optical path space 1113, as described above. The distance (interval) from the lower end of the shielding member 1115 to the wafer 1103 is preferably set to be small in order to reduce the influence of entry or diffusion of the ambient atmosphere caused by the wafer stage 1102 while suppressing the consumption amount of inert gas (purge gas). However, an excessively small interval obstructs the gas flow at the lower end of the shielding member 1115, prolonging the purge time in the optical path space 1113 with inert gas.

In the seventh embodiment, the interval between the lower end of the shielding member 1115 and the wafer 1103 is determined in consideration of the flow of the ambient atmosphere in order to reduce the influence of the ambient atmosphere and to shorten the purge time. More specifically, letting $\Delta h1$ be the interval between the lower end of the shielding member 1115 and the surface of the wafer 1103 on the upstream side of a flow 1120 to the ambient atmosphere, and $\Delta h2$ be the interval between the lower end of the shielding member 1115 and the surface of the wafer 1103 on the downstream side of the flow 1120 of the ambient atmosphere, the shape of the shielding member 1115 is so designed as to satisfy the relation: $\Delta h1 < \Delta h2$ in the seventh embodiment.

In the seventh embodiment, the flow 1120 of the ambient atmosphere coincides with a scanning direction 1130 of the wafer stage 1102. Of the shielding members 1115 on four sides, shielding members 1115 on two facing sides arranged parallel to the scanning direction 1130 are formed into the same shape. Alternatively, these shielding members 1115 are shaped axially symmetrical in the scanning direction 1130. This structure can suppress concentration nonuniformity of inert gas in the scanning direction 1130 and a direction (Y direction) perpendicular to the optical axis (Z direction). In addition, the intervals to the wafer 1103 from the lower ends of shielding members 1115 on the remaining two sides (two sides perpendicular to the scanning direction) out of the shielding members on the four sides which surround the side planes of the optical path space 1113 are preferably the same as, e.g., the distance $\Delta h1$ from the lower end of the shielding member on the upstream side of the flow of the ambient atmosphere to the wafer 1103.

The structure of the shielding members 1115 in the seventh embodiment can also be applied to a stepping and repeat exposure apparatus. Also, in this case, the purge time of gas in the optical path space can be shortened.

[Eighth Embodiment]

Figure 18:
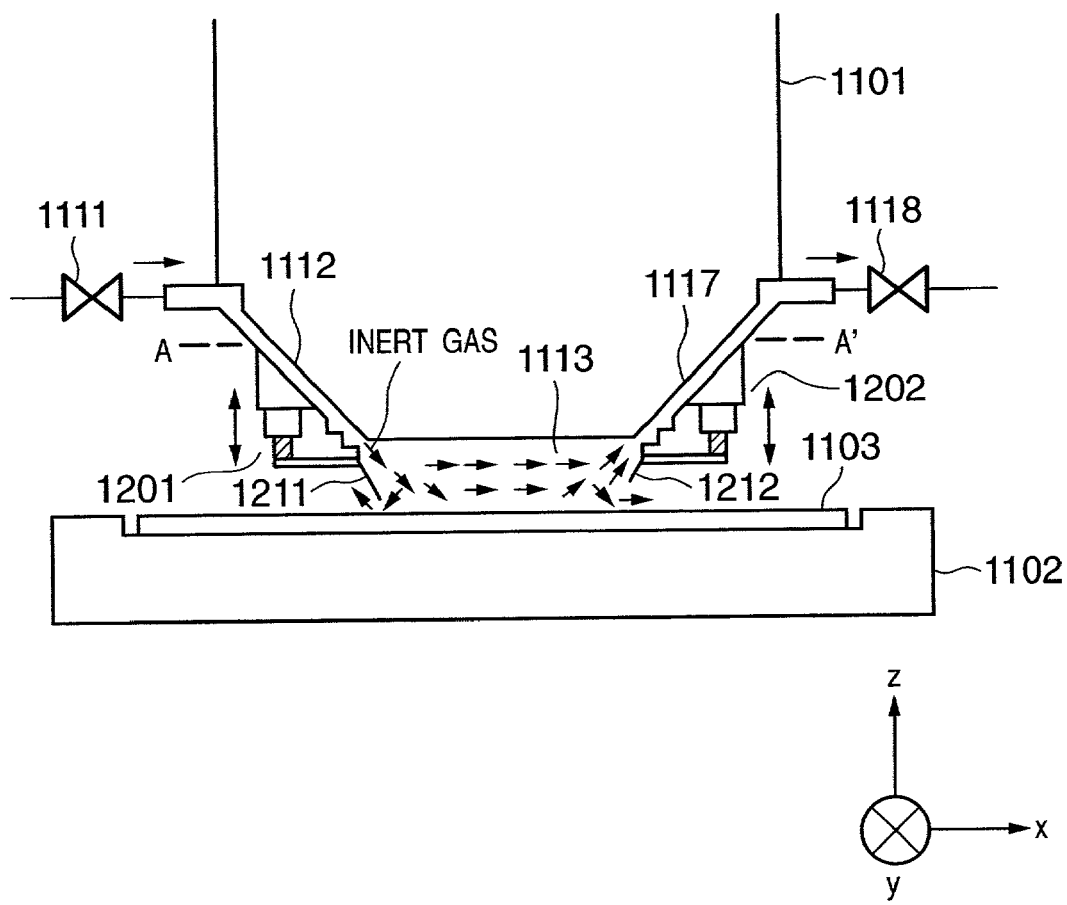
FIG. 18 is a view showing part of an exposure apparatus according to the eighth embodiment of the present invention.
Figure 19:
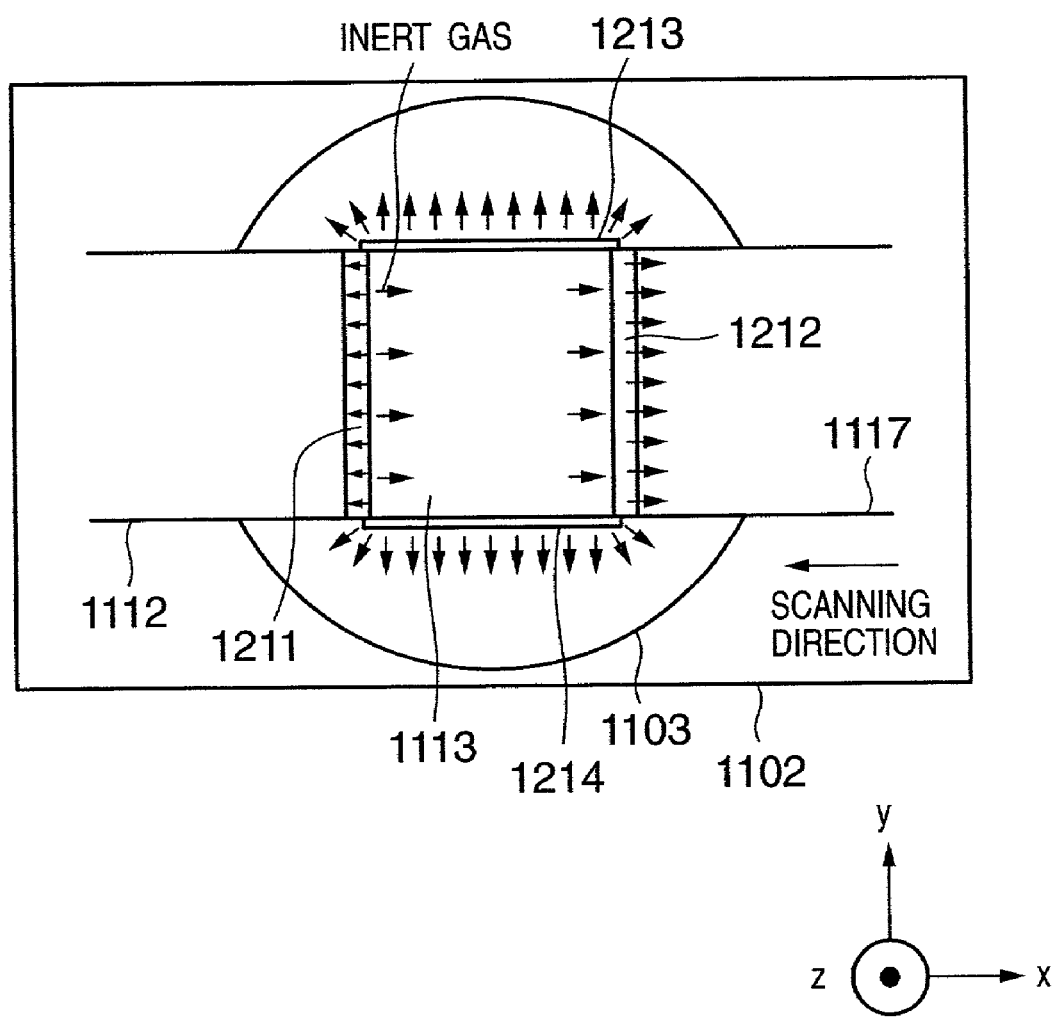
FIG. 19 is a plan view when viewed downward from the line A–A' in FIG. 18.

FIGS. 18 and 19 are views showing part of an exposure apparatus according to the eighth embodiment of the present invention. FIG. 18 is a schematic view showing the lower part of the projection optical system (lens barrel) of the exposure apparatus and the vicinity of a wafer. FIG. 19 is a plan view when viewed downward from the line A–A' in FIG. 18. FIG. 18 does not illustrate building components 1131 to 1134 in FIG. 16 for descriptive convenience.

In the eighth embodiment, the distance from the lower end of part of a shielding member to a wafer is changed in accordance with the scanning direction (moving direction) of a wafer stage 1102. More specifically, the distance to the wafer from the lower end of an element shielding member on one side in the scanning direction of an exposure operation is set to be short out of element shielding members on four sides which constitute a shielding member. In addition, the distance to the wafer from the lower end of an element shielding member on one opposite side in the scanning direction is set to be long.

As shown in FIGS. 18 and 19, the four sides of the shielding member in the eighth embodiment that surround the side planes of an optical path space 1113 are formed from first and second element shielding members 1211 and 1212 perpendicular to the scanning direction, and third and fourth element shielding members 1213 and 1214 parallel to the scanning direction. The intervals to a wafer 1103 from the lower ends of at least the element shielding members 1211 and 1212 perpendicular to the scanning direction out of the four element shielding members are changed in accordance with the scanning direction (moving direction) of the wafer stage 1102. To adjust these intervals, the first element shielding member 1211 is driven by a first driving mechanism 1201, and the second element shielding member 121 is driven by a second driving mechanism 1202.

The first element shielding member 1211 and the side wall of a gas supply port 1112 can be connected by an accordion connection member folded in a zig-zag shape or a flexible sheet-like connection member. By adopting such a connection member, airtightness can be maintained between the first element shielding member 1211 and the side wall of the gas supply port 1112. The flow path of inert gas which leaks from the optical path space 1113 to an ambient atmosphere can be restricted to the lower side of the optical path space 1113.

The third and fourth element shielding members 1213 and 1214 or at least part of them is preferably made of a transparent member which transmits alignment light.

When the wafer stage 1102 is to be scanned (moved) leftward (negative direction along the X-axis) in FIGS. 18 and 19, the first and second driving mechanisms 1201 and 1202 are so controlled as to decrease the interval between the wafer 1103 and the lower end of the first element shielding member 1211 in the scanning direction, and to increase the interval between the wafer 1103 and the lower end of the second element shielding member 1212 in a direction opposite to the scanning direction. The first and second driving mechanisms 1201 and 1202 are controlled by, e.g., a controller controlled by a main controller (corresponding to the main controller 1133 in FIG. 16). To the contrary, when the wafer stage 1102 is to be scanned (moved) rightward (positive direction along the X-axis) in FIGS. 18 and 19, the first and second driving mechanisms 1201 and 1202 are so controlled as to decrease the interval between the wafer 1103 and the lower end of the second element shielding member 1212 in the scanning direction, and to increase the interval between the wafer 1103 and the lower end of the first element shielding member 1211 in a direction opposite to the scanning direction.

Under this control, the supply amount of inert gas in a direction from which the wafer 1103 enters can be increased to suppress a decrease in the concentration of inert gas in an optical path space 1113 caused by entry of the ambient atmosphere along with movement of the wafer stage 1102. Also, the purge time of gas in the optical path space 1113 can be shortened.

As the moving speed of the wafer stage 1102 increases, entry of the ambient atmosphere into the optical path space 1113 caused by the wafer stage 1102 or the influence of the ambient atmosphere becomes more prominent. To prevent this, the interval between the lower end of the shielding member and the wafer is preferably decreased at a high moving speed of the wafer stage 1102. In this case, the purge time becomes long, but entry of the ambient atmosphere or the influence of the ambient atmosphere can be reduced.

In the eighth embodiment, the driving units are arranged for the first and second element shielding members. Entry of the ambient atmosphere by the wafer stage 1102 is suppressed, and the purge time in the optical path space 1113 with inert gas is shortened. If, however, the principal purpose is to shorten the purge time in the optical path space 1113 after wafer exchange or the like, the driving unit is attached to only an element shielding member in a direction opposite to the moving direction of the stage which enters the optical path space 1113. The supply amount of inert gas toward the coming stage can be increased, and the exhaust efficiency can be increased, thus shortening the purge time. The element shielding member having the driving unit may be set flush with another shielding member after the stage completely enters, or before or after the optical path space 1113 is completely purged with inert gas. In this case, the purge time in the optical path space 1113 with inert gas can be further shortened, and the concentration of inert gas can be easily maintained.

[Ninth Embodiment]

The purge time of gas in the optical path space must be shortened at maximum immediately after wafer exchange. After that, it is more important to maintain the atmosphere in the optical path space than to shorten the purge time.

This embodiment shortens the purge time in entry and effectively maintains the atmosphere in the optical path space after entry by controlling the level of the wafer stage when the wafer stage enters the optical path space.

Figure 20:
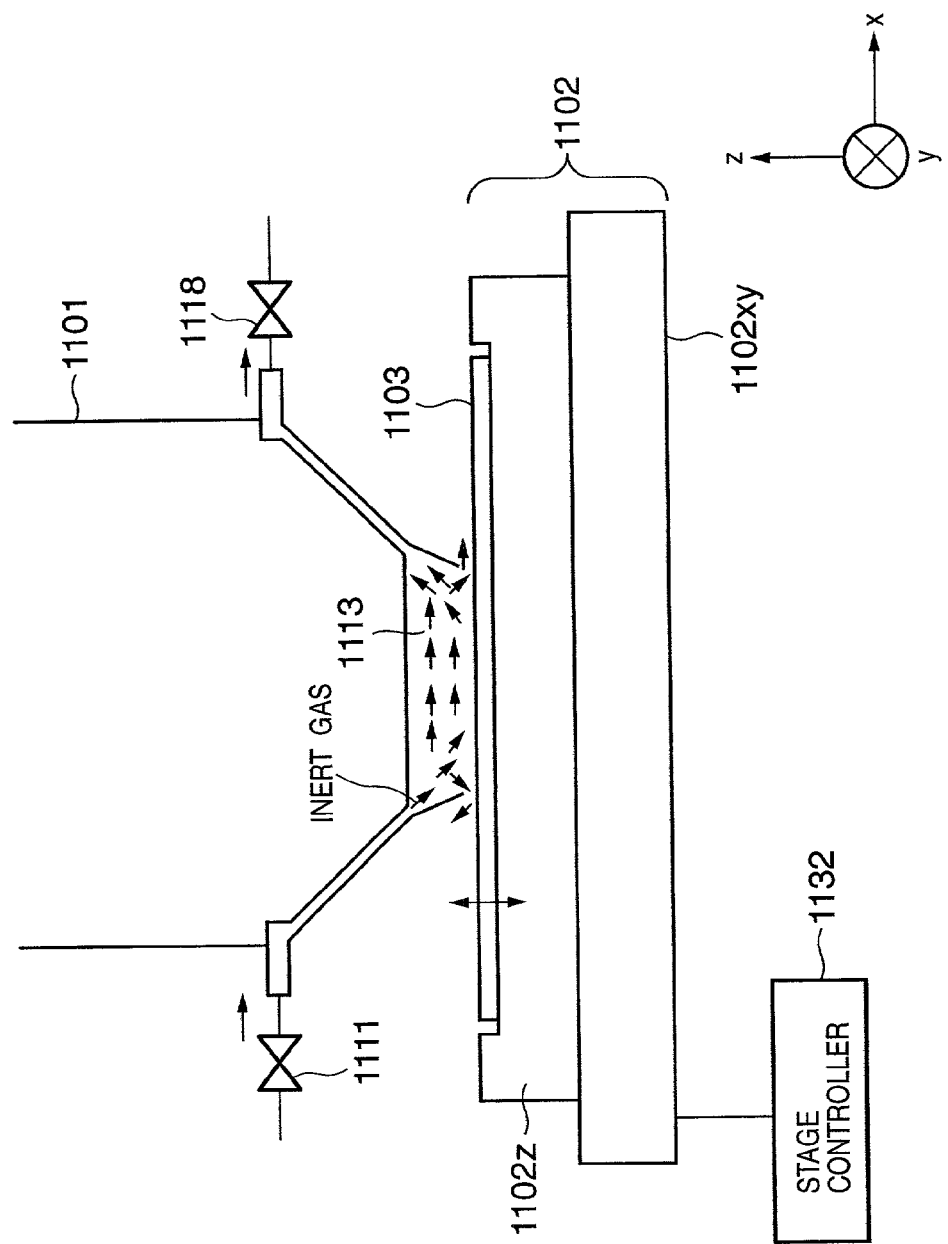
FIG. 20 is a view showing part of an exposure apparatus according to the ninth embodiment of the present invention.
Figure 21:
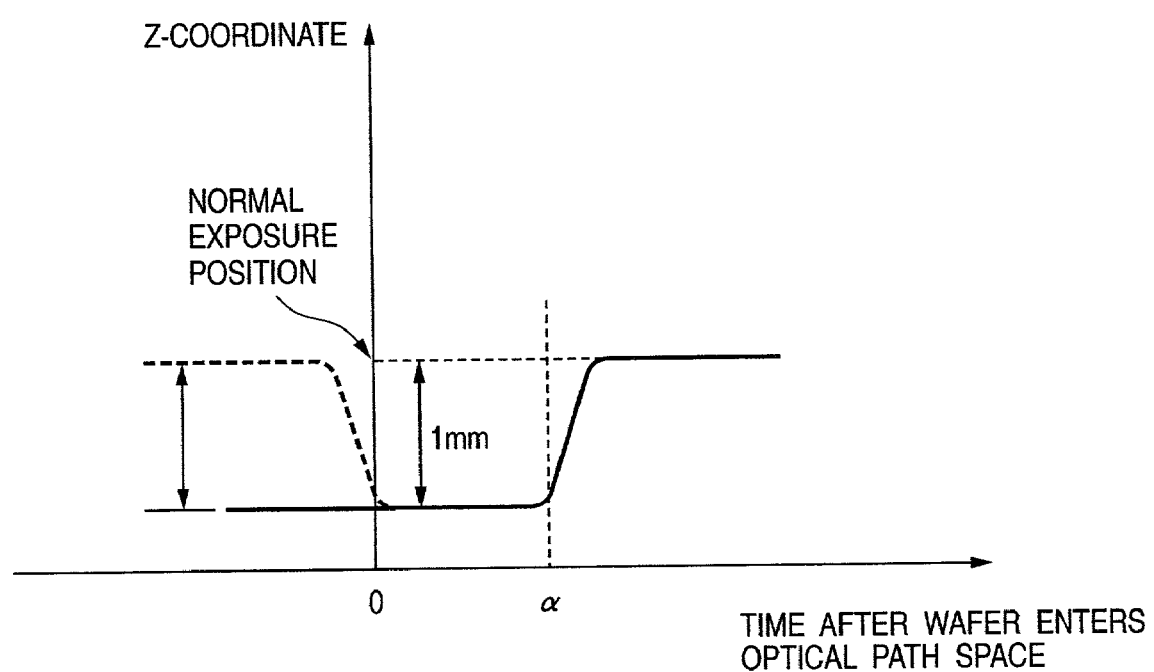
FIG. 21 is a graph showing control of a wafer stage in the Z direction (level direction) according to the ninth embodiment of the present invention.

FIG. 20 is a view showing part of an exposure apparatus according to the ninth embodiment of the present invention. FIG. 21 is a graph showing control of the wafer stage in the Z direction (direction of height). A wafer stage 1102 is constituted by, e.g., mounting a Z stage 1102z on an X-Y stage 1102xy.

In the ninth embodiment, a wafer 1103 is lowered by a predetermined distance (e.g., 1 mm) from the level set in normal exposure during a period a after the wafer 1103 on the wafer stage 1102 enters an optical path space 1113, i.e., exposure region. Then, the wafer 1103 is raised to the level set in normal exposure. This level control is executed by the Z stage 1102z. The period a is determined such that the oxygen concentration in the optical path space 1113 decreases to a default value within this period and purge is almost completed.

The ninth embodiment can be combined with the seventh and eighth embodiments.

[Tenth Embodiment]

Figure 22:
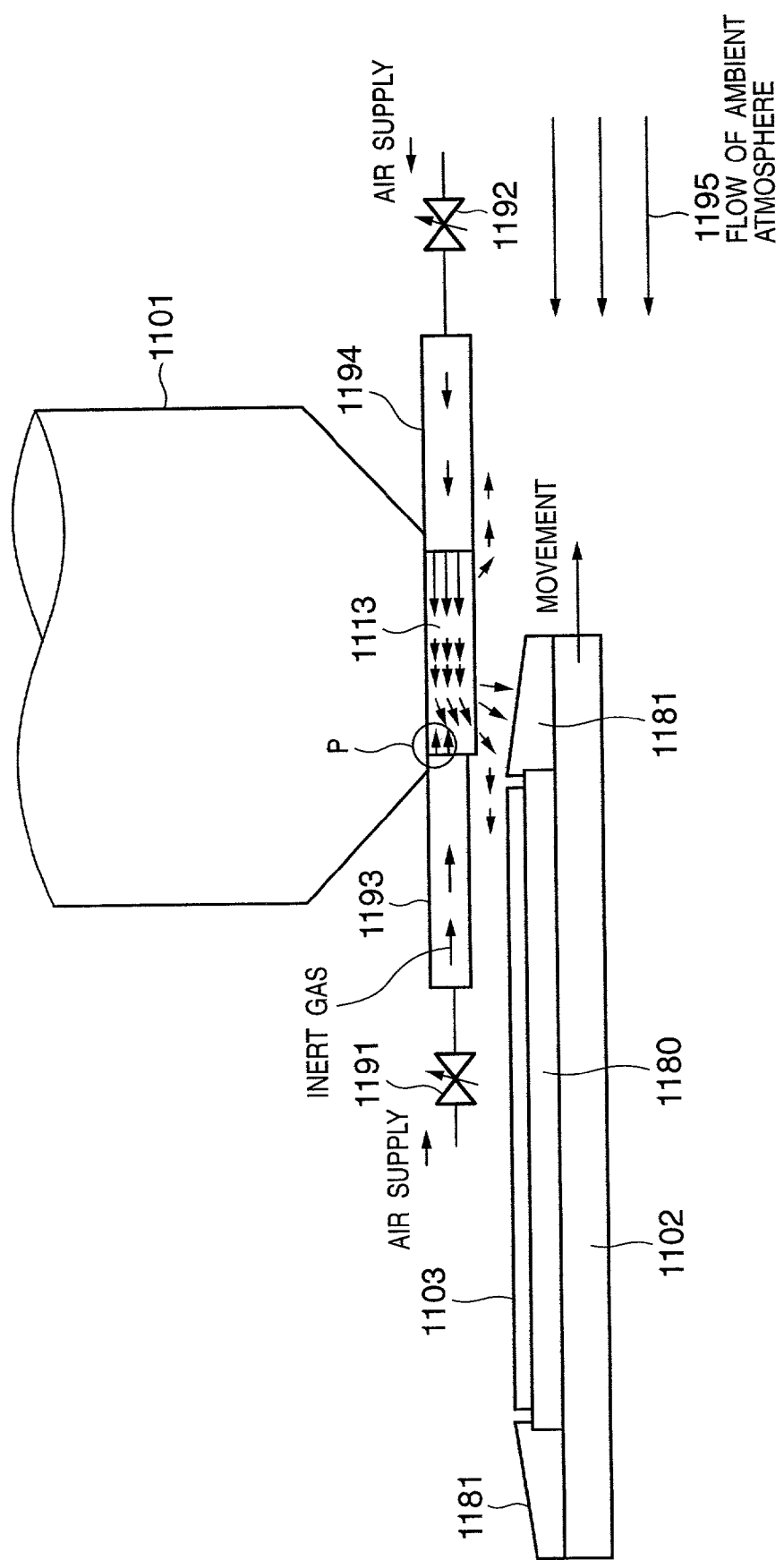
FIG. 22 is a view showing part of an exposure apparatus according to the tenth embodiment of the present invention.

FIG. 22 is a view showing part of an exposure apparatus according to the tenth embodiment of the present invention. This embodiment achieves a shorter purge time by adding the following two arrangements to the seventh to ninth embodiments.

First, a level adjustment plate 1181 with a slope sufficient enough to smoothen a change in level between a wafer 1103 and a surround portion is arranged around a wafer 1103 on a wafer stage 1102. The level adjustment plate 1181 suppresses an abrupt change in aperture ratio below an optical path space 1113 when the wafer 1103 enters the optical path space 1113. Thus, the level adjustment plate 1181 increases the exhaust efficiency of the optical path space 1113.

Second, the tenth embodiment employs two facing supply ports 1193 and 1194, and flow rate controllers 1191 and 1192 which control the flow rates of inert gas supplied to the optical paths space 1113 via the supply ports 1193 and 1194. The supply amount of inert gas from the supply port 1194 on the upstream side of a flow 1195 of an ambient atmosphere is adjusted to be larger than that of inert gas from the supply port 1193 on the downstream side. The downstream-side supply port 1193 supplies inert gas to only an upper portion in the optical path space 1113. Gas in the optical path space 1113 tends to flow in the same direction as gas in the ambient space. The purge time of gas in the optical path space 113 can, therefore, be shortened by increasing the supply amount of inert gas from the upstream-side supply port 1194 than that of inert gas from the downstream-side supply port 1193. If inert gas is supplied from only one direction, gas purge tends to delay at a portion (e.g., portion P in FIG. 22) apart from the supply port. This delay can be prevented by arranging the facing supply ports 1193 and 1194.

All or part of the two arrangements can be added to the seventh to ninth embodiments to further increase the exhaust efficiency of the optical path space 1113 and further shorten the purge time.

At the portion P in FIG. 22, the gas flow tends to delay when inert gas is supplied from only one direction, as described above. To process a wafer which produces a contaminant, the contaminant readily stays at the portion P. This embodiment can, however, remove such a contaminant by supplying inert gas from the facing supply ports 1193 and 1194 to the optical path space 1113.

[Eleventh Embodiment]

Figure 23:
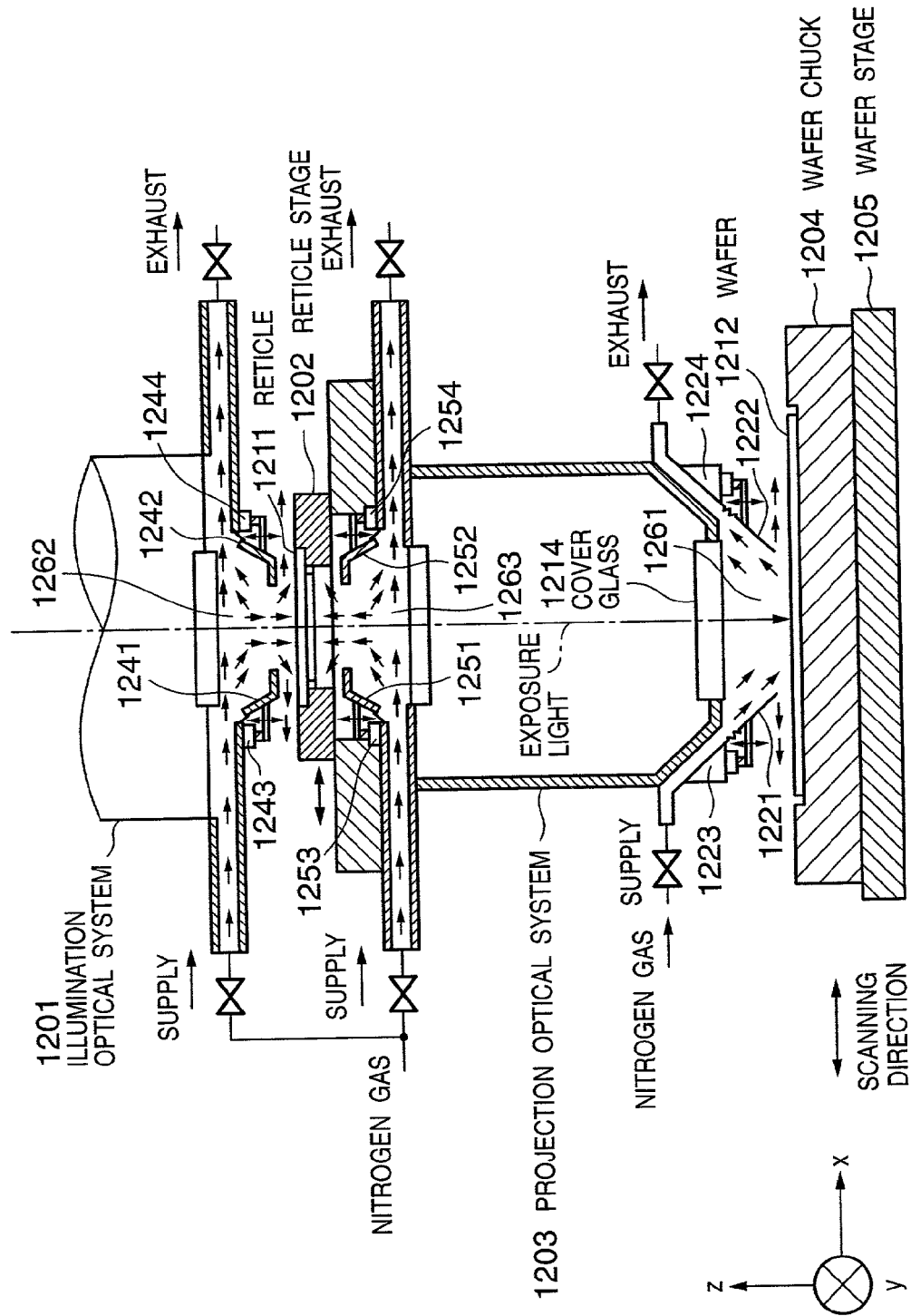
FIG. 23 is a view showing part of an exposure apparatus according to the eleventh embodiment of the present invention.

The inventions applied between the projection optical system and the wafer stage in the seventh to tenth embodiments can also be applied between the illumination optical system and the reticle stage and between the reticle stage and the projection optical system. FIG. 23 is a view showing an exposure apparatus in which the present invention is applied between the projection optical system and the wafer stage, between the illumination optical system and the reticle stage, and between the reticle stage and the projection optical system.

In the exposure apparatus shown in FIG. 23, a first shielding member made up of element shielding members on four sides including facing element shielding members 1221 and 1222 is so arranged so as to surround the side planes of a first optical path space 1261 between a final optical member (cover glass) 1214 of a projection optical system 1203 and a wafer chuck 1204 (wafer 1212). In this exposure apparatus, a second shielding member made up of element shielding members on four sides including facing element shielding members 1241 and 1242 is so arranged as to surround the side planes of a second optical path space 1262 between a reticle stage 1202 (reticle 1211) and an illumination optical system 1201 which illuminates a reticle (mask) 1211. In the exposure apparatus, a third shielding member made up of element shielding members on four sides including facing element shielding members 1251 and 1252 is so arranged as to surround the side planes of a third optical path space 1263 between the reticle stage 1202 (reticle 1211) and the projection optical system 1203.

The facing element shielding members 1221 and 1222 of the first shielding member are driven by first driving mechanisms 1223 and 1224 in accordance with the moving direction (scanning direction) of a wafer stage 1205 to separately adjust the intervals from the lower ends of the element shielding members 1221 and 1222 to the wafer 1212.

The facing element shielding members 1241 and 1242 of the second shielding member are driven by second driving mechanisms 1243 and 1244 in accordance with the moving direction (scanning direction) of the reticle stage 1202 to separately adjust the intervals from the lower ends of the element shielding members 1241 and 1242 to the reticle 1211.

The facing element shielding members 1251 and 1252 of the third shielding member are driven by third driving mechanisms 1253 and 1254 in accordance with the moving direction (scanning direction) of the reticle stage 1202 to separately adjust the intervals from the upper ends of the element shielding members 1251 and 1252 to the lower end of the reticle stage 1202.

Inert gas (e.g., nitrogen gas or helium gas) is supplied to the first to third optical path spaces 1261 to 1263.

In FIG. 23, the reticle stage 1202 is controlled by a stage controller in synchronism with the wafer stage 1205, and each valve is controlled by an environment controller. Each controller is comprehensively controlled by a main controller.

[Application of Exposure Apparatus]

Figure 14:
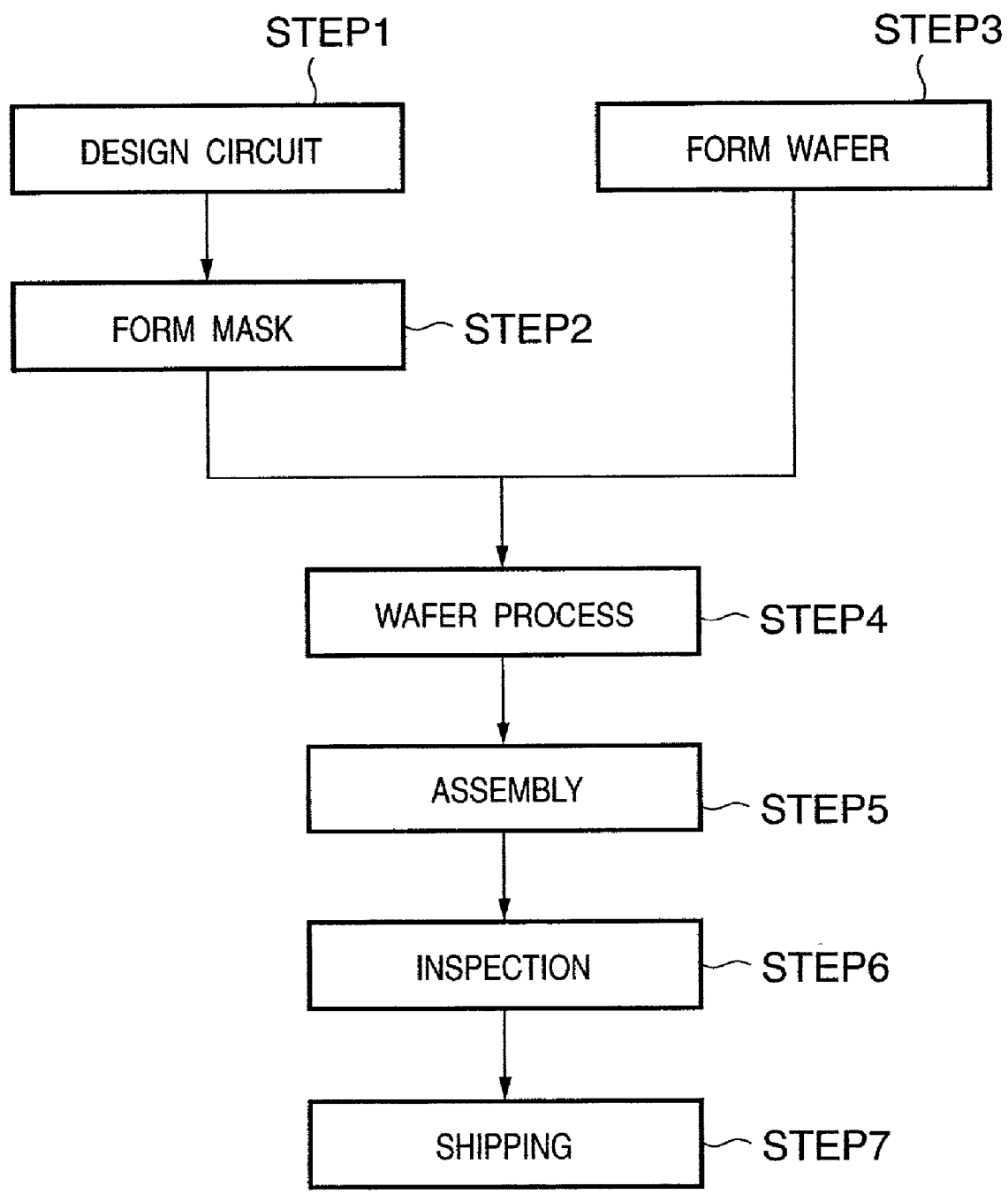
FIG. 14 is a flow chart showing the flow of the whole manufacturing process of a semiconductor device.

A semiconductor device manufacturing process using the above-described exposure apparatus will be explained. FIG. 14 shows the flow of the whole manufacturing process of the semiconductor device. In step 1 (circuit design), a semiconductor device circuit is designed. In step 2 (mask formation), a mask is formed based on the designed circuit pattern. In step 3 (wafer formation), a wafer is formed by using a material such as silicon. In step 4 (wafer process), called a pre-process, an actual circuit is formed on the wafer by lithography using the mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 15:
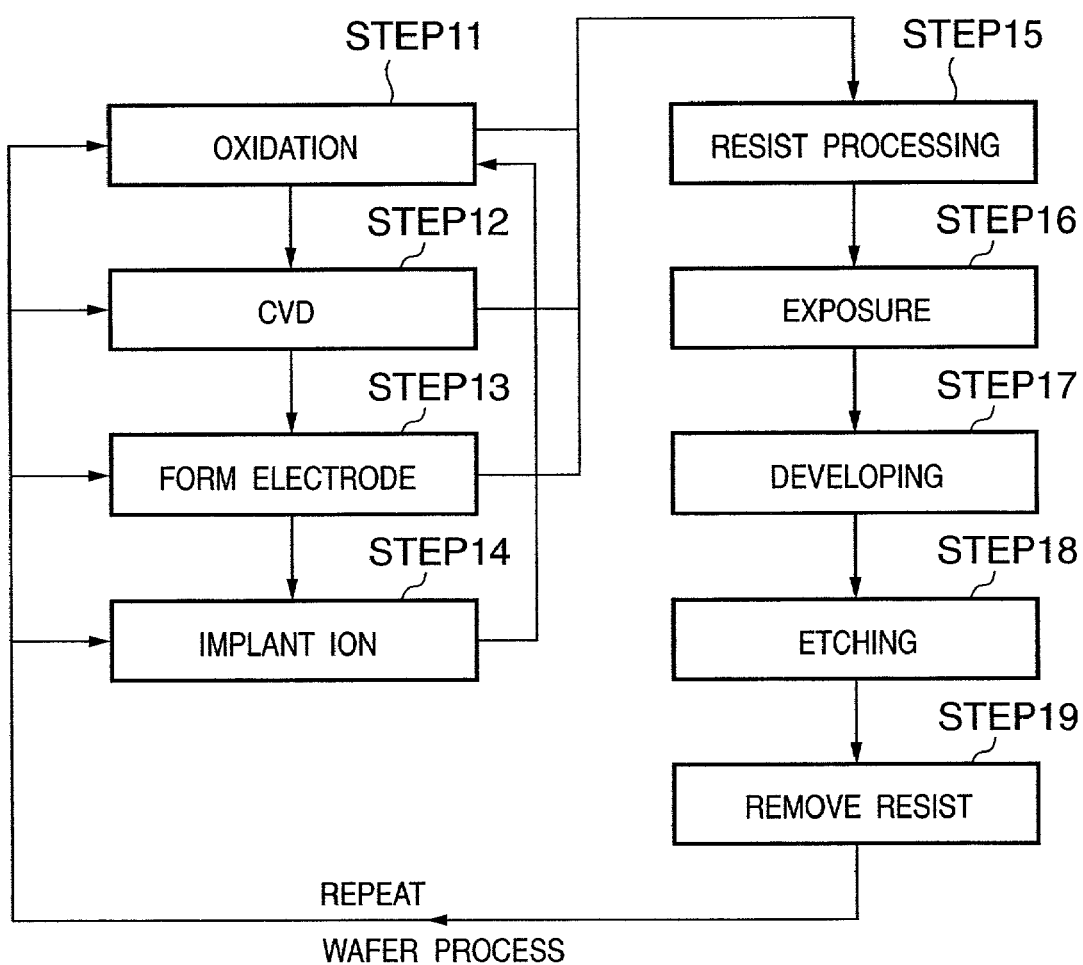
FIG. 15 is a flow chart showing the detailed flow of the wafer process in FIG. 14.

FIG. 15 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers the circuit pattern onto the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

The present invention can shorten a time required to purge, with inert gas, gas in a space (optical path space) through which exposure light passes, increasing the throughput.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which projects a pattern formed on a mask to a substrate by using exposure light, said apparatus comprising:
   a shielding member which surrounds a light path space through which exposure light passes and has a passage which makes the light path space communicate with an ambient space; and
   a gas supply system which supplies inert gas to the light path space surrounded by said shielding member,
   wherein a direction of said passage coincides with a flow direction of an ambient atmosphere which flows through the ambient space, and said passage includes a first passage and a second passage, said first passage being at a position upstream, with respect to the flow direction, relative to said second passage, and said first passage is smaller in section than said second passage.

2. An apparatus according to claim 1, further comprising an exhaust system which exhausts inert gas from the light path space.

3. An apparatus according to claim 1, further comprising a stage which holds one of the mask and the substrate and moves, wherein the light path space is adjacent to said stage, and the direction of said passage coincides with a moving direction of said stage during scanning exposure.

4. An apparatus according to claim 1, wherein said supply system supplies inert gas to the light path space so that a pressure of the light path space is positive relative to a pressure of the ambient space.

5. An apparatus according to claim 1, wherein at least a part of said shielding member is formed from a member which transmits alignment light.

6. An apparatus according to claim 1, wherein the inert gas includes one of nitrogen gas and helium gas.

7. A device manufacturing method comprising steps of:
   projecting a pattern formed on a mask to a substrate using an exposure apparatus as recited in claim 1; and
   developing the substrate to which the pattern has been projected.

8. An exposure apparatus which projects a pattern formed on a mask to a substrate by using exposure light, said apparatus comprising:

a stage;

an optical system;

a shielding member which surrounds a light path space, between said stage and said optical system, through which exposure light passes, and includes first and second parts arranged to face each other;

a supply system which supplies inert gas to the light path space surrounded by said shielding member; and a drive system which drives at least one of said first and second parts so as to adjust an interval between one of said first and second parts and said stage.

9. An apparatus according to claim 8, wherein said drive system drives at least one of said first and second parts in accordance with a moving direction of said stage.

10. An apparatus according to claim 9, wherein said drive system drives at least one of said first and second parts so that an interval between one of said first and second parts, under which said stage enters the light path space, and said stage is smaller than an interval between the other of said first and second parts and said stage.

11. An apparatus according to claim 8, wherein said drive system drives at least one of said first and second parts in accordance with a moving speed of said stage.

12. An apparatus according to claim 8, further comprising a stage controller which controls said stage to adjust an interval between said shielding member and said stage.

13. An apparatus according to claim 12, wherein said stage controller controls said stage so as to set the interval between said shielding member and said stage to a first interval when said stage enters the light path space, and then to set the interval to a second interval smaller than the first interval.

14. An apparatus according to claim 8, wherein said supply system supplies inert gas to the light path space so that a pressure of the light path space is positive relative to a pressure of an ambient space.

15. An apparatus according to claim 8, wherein at least a part of said shielding member is formed from a member which transmits alignment light.

16. An apparatus according to claim 8, wherein the inert gas includes one of nitrogen gas and helium gas.

17. An apparatus according to claim 8, further comprising an exhaust system which exhausts inert gas from the light path space.

18. An apparatus according to claim 8, wherein said stage holds one of the mask and the substrate.

19. A device manufacturing method comprising steps of:

projecting a pattern formed on a mask to a substrate using an exposure apparatus as recited in claim 8; and developing the substrate to which the pattern has been projected.

* * * * *